(12) United States Patent
Craig et al.

(10) Patent No.: US 7,649,077 B2
(45) Date of Patent: Jan. 19, 2010

(54) POLYMERS FOR USE IN OPTICAL DEVICES

(75) Inventors: Michael Robert Craig, New York, NY (US); Jonathan Rogers, White Plains, NY (US); Thomas Schäfer, Basel (CH)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 542 days.

(21) Appl. No.: 10/531,779

(22) PCT Filed: Oct. 21, 2003

(86) PCT No.: PCT/EP03/11634

§ 371 (c)(1),
(2), (4) Date: Apr. 19, 2005

(87) PCT Pub. No.: WO2004/039864

PCT Pub. Date: May 13, 2004

(65) Prior Publication Data

US 2006/0025564 A1 Feb. 2, 2006

(30) Foreign Application Priority Data

Oct. 30, 2002 (GB) .................. 0225244.3
Apr. 23, 2003 (EP) .................. 03101113

(51) Int. Cl.
*C08G 73/00* (2006.01)
*C08G 73/06* (2006.01)
*C08G 61/00* (2006.01)
*C08G 61/12* (2006.01)

(52) U.S. Cl. ............ 528/423; 528/422; 428/690; 428/917; 257/E51.049

(58) Field of Classification Search ............ 528/422, 528/423; 428/690, 917; 257/E51.049
See application file for complete search history.

(56) References Cited

U.S. PATENT DOCUMENTS

| | | | |
|---|---|---|---|
| 5,876,864 A | 3/1999 | Kim et al. | 428/690 |
| 2001/0012572 A1 | 8/2001 | Araki | 428/690 |
| 2004/0234810 A1 | 11/2004 | Doi et al. | |
| 2005/0038223 A1 | 2/2005 | Becker et al. | 528/86 |

FOREIGN PATENT DOCUMENTS

| | | |
|---|---|---|
| DE | 10143353 | 3/2003 |
| JP | 2002105444 | 4/2002 |
| WO | 98/11150 | 3/1998 |
| WO | 02/102925 | 12/2002 |

OTHER PUBLICATIONS

Yu et al; Synthesis and characterization of poly(aryl ether)s containing the pyrimidine moiety; 1998; Journal of polyemr Science, Polymer Chemistry (19980, 36(7), 1107-1110; Chem Abstract 128: 308835.*
Koton et al., Vysokomolekulyarnye Soedin., Seriya B: Kratkie Soobshcheniya, vol. 20, No. 10, (1978), pp. 792-793.
Vais et al., Izv. Sib. Otd. Akad. Nauk. SSSR, vol. 6, (1975), pp. 144-146.
Bajic et al., Molecules, vol. 6, No. 5, (2001), pp. 477-480.
Patent Abstracts of Japan Pub. No. 2002105444, Apr. 10, 2002.

* cited by examiner

*Primary Examiner*—Duc Truong
(74) *Attorney, Agent, or Firm*—Joseph C. Suhadolnik

(57) ABSTRACT

The present invention relates to polymers comprising diazine, especially pyrimidine, containing repeating units. Optical devices, comprising the polymers of the present invention, can show significant advantages in color purity, device efficiency and/or operational lifetime. In addition, the polymers can have good solubility characteristics and relatively high glass transition temperatures, which facilitates their fabrication into coatings and films that are relatively thin, thermally stable, and relatively free of defects.

3 Claims, No Drawings

POLYMERS FOR USE IN OPTICAL DEVICES

The present invention relates to novel polymers comprising pyrimidine containing repeating units and to their use in optical devices, such as an optical device comprising an electroluminescent device or a photovoltaic device.

Derivatives of poly(p-phenylenevinylene) have been known for some time as electroluminescence (EL) materials (see, for example, WO90/13148).

WO98/11150 discloses triazine polymers of formula

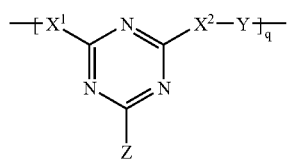

and their use in electroluminescence (EL) arrangements.

U.S. Pat. No. 5,876,864 relates to fluorene-based alternating polymers and their use as electroluminescence materials.

M. M. Koton et al., Vysokomolekulyarnye Soedin.; Seriya B: Kratkie Soobshcheniya, vol. 30, no. 10, 1978, 792-793 disclose polyimides on the basis of 2-phenyl-4,6-bis(p-aminophenyl)pyrimidine:

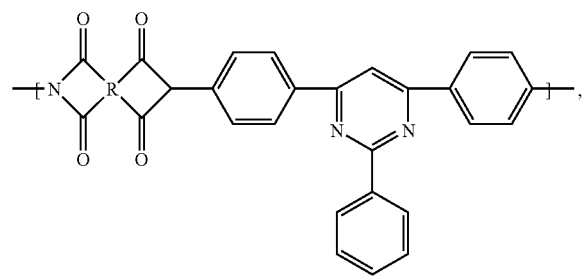

wherein R is a group of formula

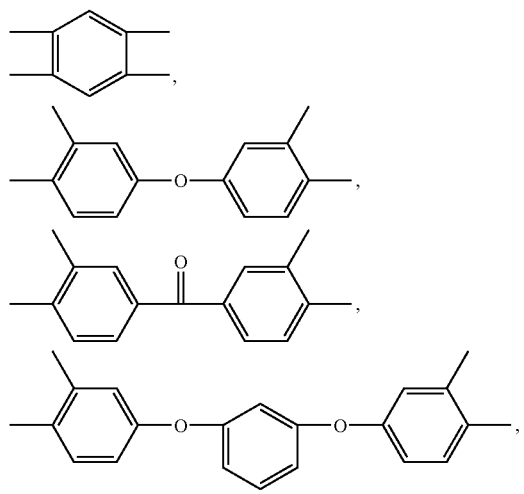

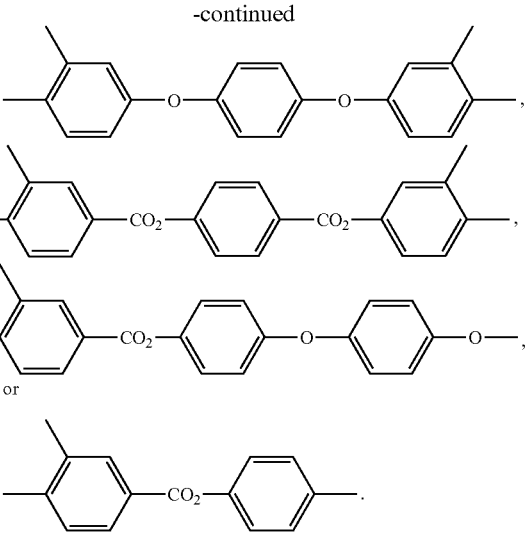

DE-A-10143353 discloses conjugated polymers, containing spirobifluorene units and optionally a pyrimidine based unit of the following formula

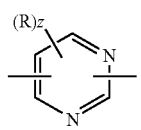

and their use as electroluminescence materials.

US2001/0012572 discloses pyrimidine units containing polymers of the following formulae

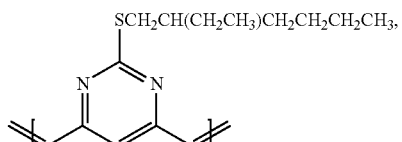

(Mw = 23000)

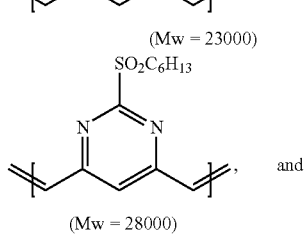

(Mw = 28000)

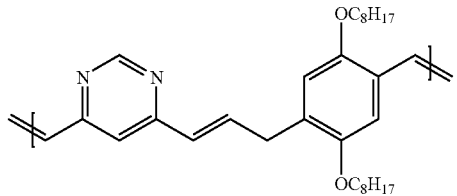

Mw 4300 and their use as electroluminescence materials.

WO00/46321 and U.S. Pat. No. 6,512,083 relate to fluorene-containing polymers and their use in EL arrangements.

EP-A-690052 discloses the use of pyrimidine containing conjugated compounds, such as for example

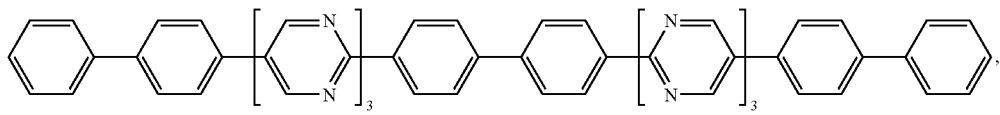

as electroluminescent materials.

WO02/059121 discloses monomers having formula

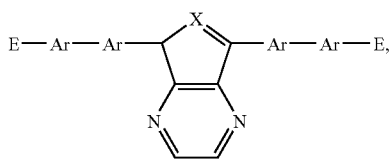

wherein X is O, S, NR, RC—CR, or RC=CR, Ar is an aryl or heteroaryl group, and E is a reactive group capable of undergoing chain extension and their use for the production of polymers which can be used in optical devices (see also WO01/62869).

DE-A-19651439 (U.S. Pat. No. 6,323,373) relates to polymerizable biaryl derivatives of the formula

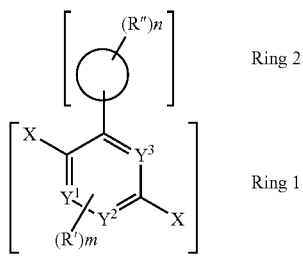

where the symbols and indices have the following meanings:

X: —CH$_2$—Z, —CHO;

Y$^1$, Y$^2$, Y$^3$: CH; N,

Z: identical or different, I, Cl, Br, CN, SCN, NCO, PO(OR$^1$)$_2$, PO(R$^2$)$_2$, P(R$^3$)$_3$$^+$ A$^-$;

Aryl: an aryl group having from 6 to 14 carbon atoms;

R', R'': identical or different, CN, F, Cl, a straight-chain or branched or cyclic alkyl or alkoxy group having from 1 to 20 carbon atoms, where one or more nonadjacent CH$_2$ groups is optionally replaced by —O—, —S—, —CO—, —COO—, —O—CO—, —NR$^4$—, —(NR$^5$R$^6$)$^+$A$^-$ or —CONR$^7$— and one or more H atoms is optionally replaced by F, or an aryl group having from 6 to 14 carbon atoms which may be substituted by one or more nonaromatic radicals R';

R$^1$, R$^2$, R$^3$, R$^5$, R$^6$: identical or different, aliphatic or aromatic hydrocarbon radicals having from 1 to 20 carbon atoms;

R$^4$, R$^7$: identical or different, hydrogen or aliphatic or aromatic hydrocarbon radicals having from 1 to 20 carbon atoms;

A$^-$: a singly charged anion or its equivalent;

m: 0, 1 or 2;

n: 1, 2, 3, 4 or 5 and their use for the production of polymers.

There are a number of challenges faced with the introduction of organic EL displays when their performance is compared with existing technologies. Obtaining the exact color coordinates required by specific guidelines (i.e. NTSC) has been problematic. The operational lifetime of the EL device is relatively lower when contrasted to the existing inorganic technology. In addition, producing a material with a pure blue color and a long lifetime is one of the greatest problems for this industry.

Accordingly, it is the object of the present invention to provide novel materials, which show significant advantages in color purity, device efficiency and/or operational lifetime, when incorporated in optical devices.

Said object is solved by the polymers of the present invention comprising diazine, especially pyrimidine, containing repeating units. Optical devices, comprising the polymers of the present invention, can show significant advantages in color purity, device efficiency and/or operational lifetime. In addition, the polymers can have good solubility characteristics and relatively high glass transition temperatures, which facilitates their fabrication into coatings and films that are relatively thin, thermally stable, and relatively free of defects. If the polymers contain end groups which are capable of being crosslinked, the crosslinking of such groups after the films or coating is formed increases the solvent resistance thereof, which is beneficial in applications wherein one or more solvent-based layers of material are deposited thereon.

Accordingly, the polymers of the present invention should have a glass transition temperature above 100° C., especially a glass transition temperature above 150° C.

As used herein the term "polymer of the present invention" refers to polymers having repeating units of formula I, including formula Ia and Ib, and/or II, including formula IIa, IIb and IIc.

In a first aspect, the present invention relates to polymers comprising a repeating unit of the formula

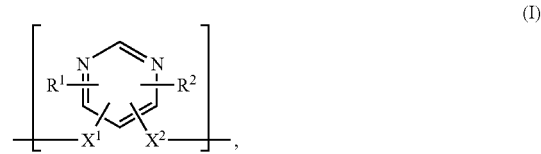

wherein R$^1$ and R$^2$ are independently of each other an organic substituent, especially C$_6$-C$_{30}$aryl or a C$_2$-C$_{26}$heteroaryl, which optionally can be substituted, X$^1$ and X$^2$ are independently of each other a divalent linking group, wherein repeating units of formula

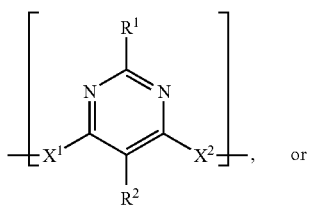, or
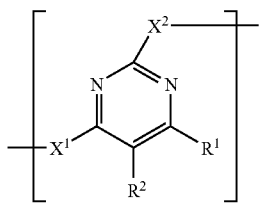
are preferred.
Examples of suitable divalent linking groups $X^1$ and $X^2$ are a single bond, —CO—, —COO—; —S—;
—SO—; —SO$_2$—; —O—; 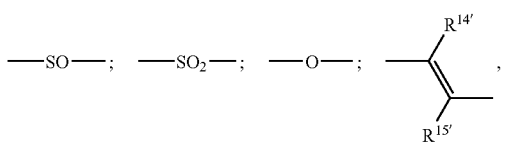
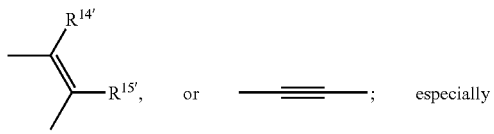, or —≡—; especially
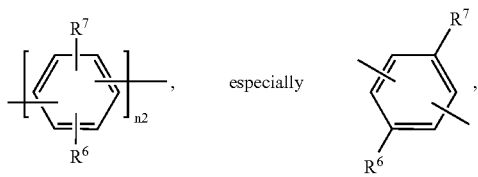, especially 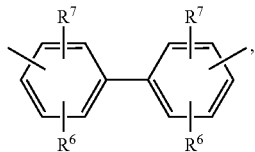,
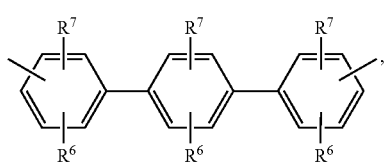,
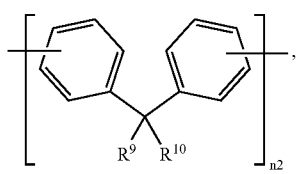,
(Ia)
(Ib)
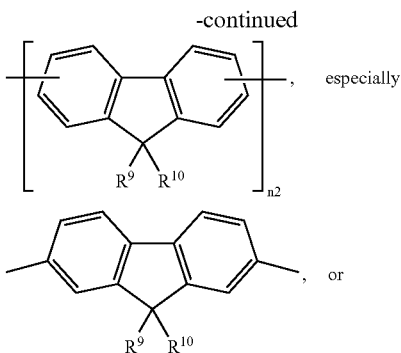, especially
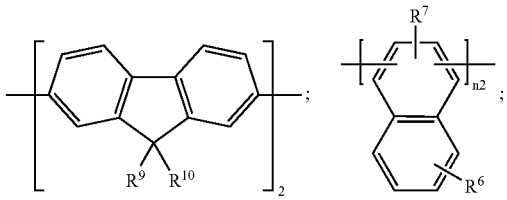, or
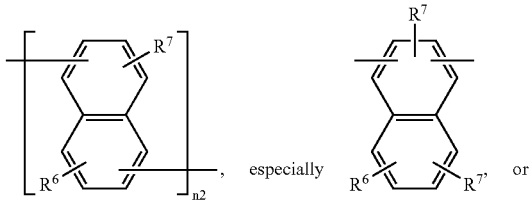;
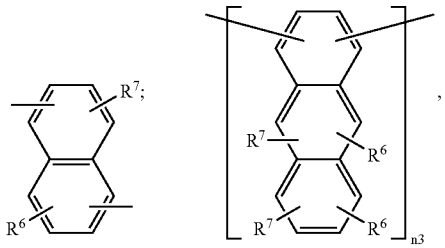, especially 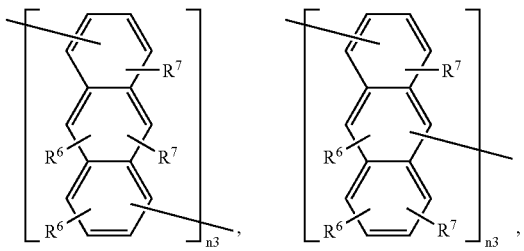, or
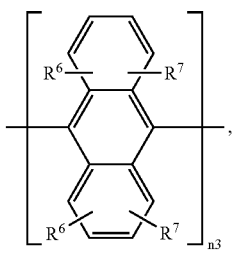;
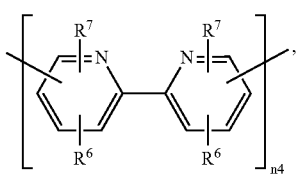
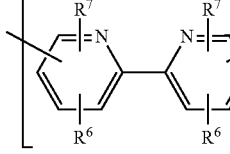
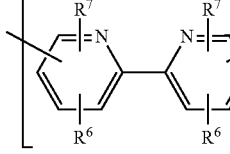
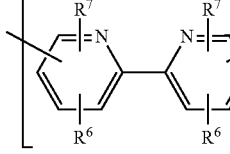

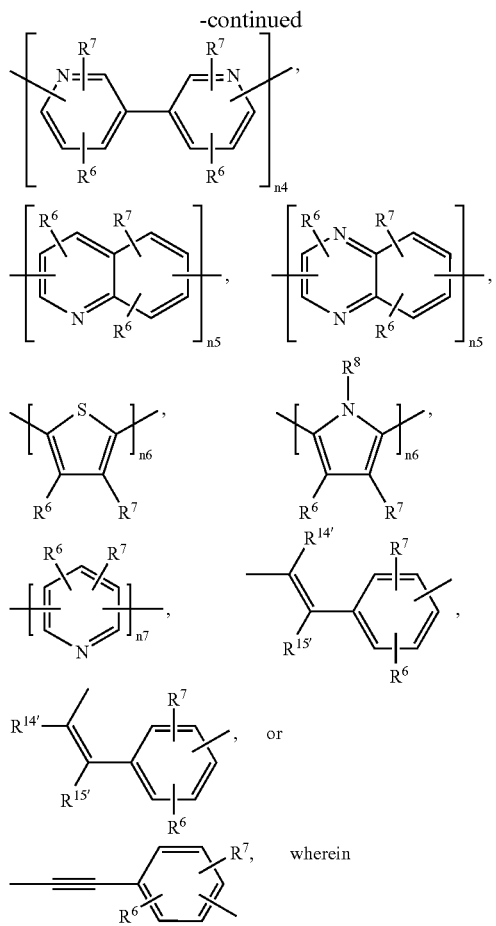

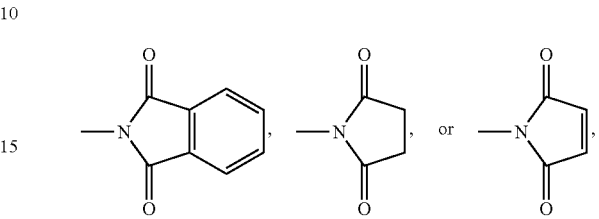

n1, n2, n3, n4, n5, n6 and n7 are integers of 1 to 10, in particular 1 to 3, $R^6$ and $R^7$ are independently of each other H, $C_1$-$C_{18}$alkyl, $C_1$-$C_{18}$alkyl which is substituted by E and/or interrupted by D, $C_5$-$C_{12}$cycloalkyl, $C_5$-$C_{12}$cycloalkyl, which is substituted by E, $C_6$-$C_{24}$aryl, $C_6$-$C_{24}$aryl which is substituted by E, $C_2$-$C_{20}$heteroaryl, $C_2$-$C_{20}$heteroaryl which is substituted by E, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —CO—$R^{28}$, $R^8$ is $C_1$-$C_{18}$alkyl, $C_1$-$C_{18}$alkyl which is substituted by E and/or interrupted by D, $C_6$-$C_{24}$ aryl, or $C_7$-$C_{25}$aralkyl, $R^9$ and $R^{10}$ are independently of each other $C_1$-$C_{18}$ alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{20}$heteroaryl, $C_2$-$C_{20}$heteroaryl which is substituted by E, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or $R^9$ and $R^{10}$ form a ring, especially a five- or six-membered ring, which may optionally be substituted by $R^6$, $R^{14'}$ and $R^{15'}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{20}$heteroaryl, or $C_2$-$C_{20}$heteroaryl which is substituted by E, D is —CO—; —COO—; —S—; —SO—; —SO$_2$—; —O—; —NR$^{25}$—; —SiR$^{30}$R$^{31}$—; —POR$^{32}$—; —CR$^{23}$═CR$^{24}$—; or —C≡C—; and E is —OR$^{28}$; —SR$^{29}$; —NR$^{25}$R$^{26}$; —COR$^{28}$; —COOR$^{27}$; —CONR$^{25}$R$^{26}$; —CN; —OCOOR$^{27}$; or halogen; wherein $R^{23}$, $R^{24}$, $R^{25}$ and $R^{26}$ are independently of each other H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, in particular $R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, $R^{29}$ is H; $C_6$-$C_{18}$aryl; $C_6$-$C_{18}$aryl, which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{32}$ is $C_1$-$C_{18}$alkyl, $C_6$-$C_{18}$aryl, or $C_6$-$C_{18}$aryl, which is substituted by $C_1$-$C_{18}$alkyl.

Preferably, $R^6$ and $R^7$ are independently of each other H, $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, or n-heptyl, $C_1$-$C_{18}$alkyl which is substituted by E and/or interrupted by D, such as —CH$_2$OCH$_3$, —CH$_2$OCH$_2$CH$_3$, —CH$_2$OCH$_2$CH$_2$OCH$_3$, or —CH$_2$OCH$_2$CH$_2$OCH$_2$CH$_3$, $C_6$-$C_{24}$aryl, such as phenyl, naphthyl, or biphenyl, $C_5$-$C_{12}$cycloalkyl, such as cyclohexyl, $C_6$-$C_{24}$aryl which is substituted by E, such as —C$_6$H$_4$OCH$_3$, —C$_6$H$_4$OCH$_2$CH$_3$, —C$_6$H$_3$(OCH$_3$)$_2$, or —C$_6$H$_3$(OCH$_2$CH$_3$)$_2$, —C$_6$H$_4$CH$_3$, —C$_6$H$_3$(CH$_3$)$_2$, —C$_6$H$_2$(CH$_3$)$_3$, or —C$_6$H$_4$tBu.

$R^8$ is preferably H, $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, n-heptyl, or $C_6$-$C_{24}$aryl, such as phenyl, naphthyl, or biphenyl.

Preferably, $R^9$ and $R^{10}$ are independently of each other H, $C_1$-$C_{18}$alkyl, such as n-butyl, sec-butyl, hexyl, octyl, or 2-ethyl-hexyl, $C_1$-$C_{18}$alkyl which is substituted by E and/or interrupted by D, such as —CH$_2$(OCH$_2$CH$_2$)$_w$OCH$_3$, w=1, 2, 3, or 4, $C_6$-$C_{24}$aryl, such as phenyl, naphthyl, or biphenyl, $C_6$-$C_{24}$aryl which is substituted by E, such as —C$_6$H$_4$OCH$_3$, —C$_6$H$_4$OCH$_2$CH$_3$, —C$_6$H$_3$(OCH$_3$)$_2$, —C$_6$H$_3$(OCH$_2$CH$_3$)$_2$, —C$_6$H$_4$CH$_3$, —C$_6$H$_3$(CH$_3$)$_2$, —C$_6$H$_2$(CH$_3$)$_3$, or —C$_6$H$_4$tBu, or $R^9$ and $R^{10}$ together form a 4 to 8 membered ring, especially a 5 or 6 membered ring, such as cyclohexyl, or cyclopentyl, which can optionally be substituted by $C_1$-$C_8$alkyl.

Preferably, $R^{14'}$ and $R^{15'}$ are independently of each other H, $C_1$-$C_{18}$alkyl, such as methyl, ethyl, n-propyl, iso-propyl, n-butyl, isobutyl, or sec-butyl, or $C_6$-$C_{24}$aryl, such as phenyl, naphthyl, or biphenyl.

D is preferably —CO—, —COO—, —S—, —SO—, —SO$_2$—, —O—, —NR$^{25}$—, wherein R$^{25}$ is $C_1$-$C_{18}$alkyl, such as methyl, ethyl, n-propyl, iso-propyl, n-butyl, isobutyl, or sec-butyl, or $C_6$-$C_{24}$aryl, such as phenyl, naphthyl, or biphenyl.

E is preferably —$OR^{29}$; —$SR^{29}$; —$NR^{25}R^{25}$; —$COR^{28}$; —$COOR^{27}$; —$CONR^{25}R^{25}$; or —CN; wherein $R^{25}$, $R^{27}$, $R^{28}$ and $R^{29}$ are independently of each other $C_1$-$C_{18}$alkyl, such as methyl, ethyl, n-propyl, iso-propyl, n-butyl, isobutyl, sec-butyl, hexyl, octyl, or 2-ethyl-hexyl, or $C_6$-$C_{24}$ aryl, such as phenyl, naphthyl, or biphenyl.

Among the above-mentioned groups $X^1$ and $X^2$ the following groups are preferred:

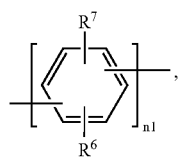, 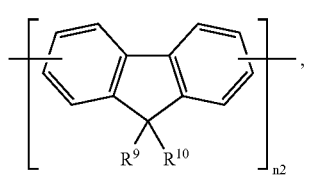,

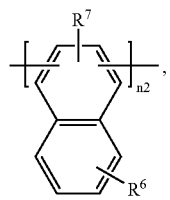, 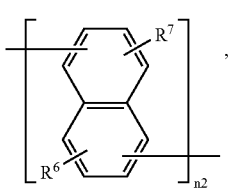,

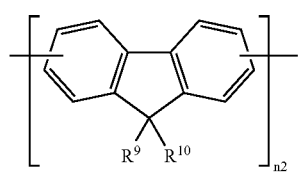 and

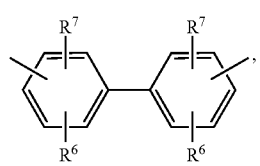, wherein the substituents are defined as above.

$R^1$ and $R^2$ can in principal be any organic substituent, provided he does not have negative influence on the (electro) luminescent characteristics of the polymers. Examples of $R^1$ and $R^2$ are H, $C_1$-$C_{18}$ alkyl, $C_1$-$C_{18}$alkyl which is substituted by E and/or interrupted by D, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl,

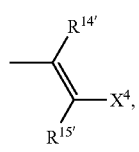, 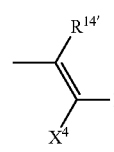, , $C_6$-$C_{24}$aryl, or $C_2$-$C_{20}$heteroaryl, which optionally can be substituted, especially a group of the formula

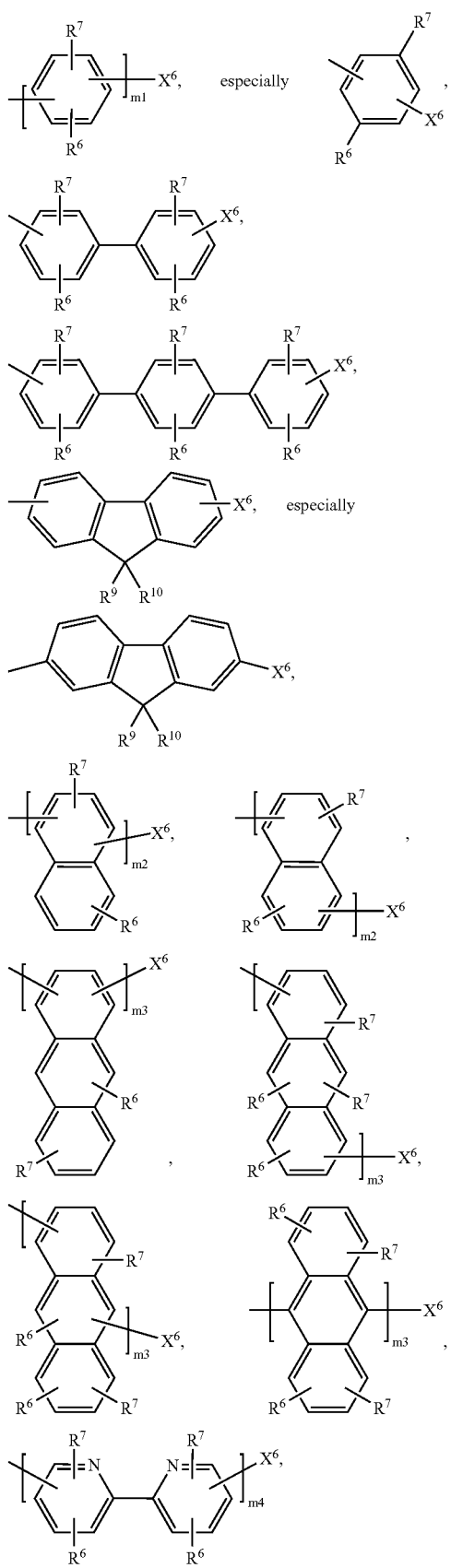

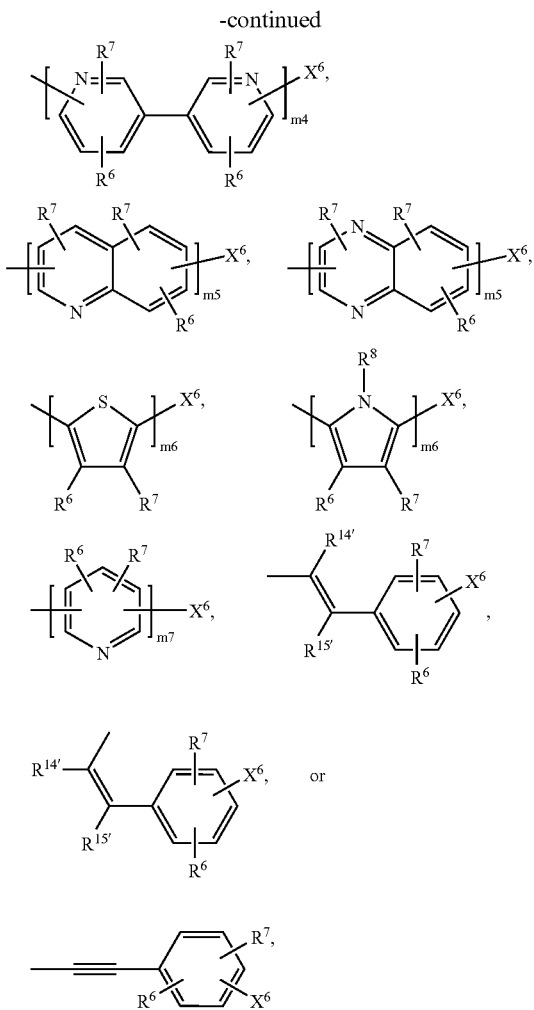

wherein m1, m2, m3, m4, m5, m6 and m7 are integers of 1 to 10, in particular 1 to 3, $X^6$ is H, $C_1$-$C_{18}$alkyl, $C_1$-$C_{18}$alkyl which is substituted by E and/or interrupted by D, $C_6$-$C_{24}$aryl, which optionally can be substituted, especially

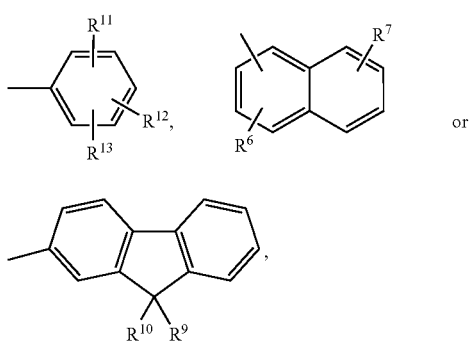

$C_2$-$C_{20}$heteroaryl, which optionally can be substituted, especially

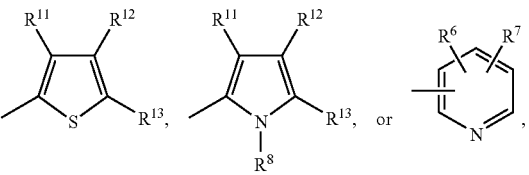

$C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, $X^4$ is $C_1$-$C_{18}$alkyl, $C_1$-$C_{18}$alkyl which is substituted by E and/or interrupted by D, $C_6$-$C_{24}$aryl, which optionally can be substituted, $X^5$ is $C_1$-$C_{18}$alkyl, $C_6$-$C_{24}$aryl, $C_6$-$C_{24}$aryl substituted by —$OC_1$-$C_{18}$alkyl or —$OC_6$-$C_{24}$aryl, $R^{11}$, $R^{12}$ and $R^{13}$ are independently of each other H, $C_1$-$C_{18}$ alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, and D, E, $R^6$, $R^7$, $R^8$, $R^9$, $R^{10}$, $R^{14'}$ and $R^{15'}$ are as defined above.

Preferably, $R^6$ and $R^7$ are independently of each other H, $C_1$-$C_{18}$ alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, or n-heptyl, $C_1$-$C_{18}$alkyl which is substituted by E and/or interrupted by D, such as —$CH_2OCH_3$, —$CH_2OCH_2CH_3$, —$CH_2OCH_2CH_2OCH_3$, or —$CH_2OCH_2CH_2OCH_2CH_3$, $C_5$-$C_{12}$cycloalkyl, such as cyclohexyl, $C_6$-$C_{24}$aryl, such as phenyl, naphthyl, or biphenyl, $C_6$-$C_{24}$aryl which is substituted by E, such as —$C_6H_4OCH_3$, —$C_6H_4OCH_2CH_3$, —$C_6H_3(OCH_3)_2$, or —$C_6H_3(OCH_2CH_3)_2$, —$C_6H_4CH_3$, —$C_6H_3(CH_3)_2$, —$C_6H_2(CH_3)_3$, or —$C_6H_4tBu$.

$R^8$ is preferably H, $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, and n-heptyl, or $C_6$-$C_{24}$aryl, such as phenyl, naphthyl, or biphenyl.

Preferably, $R^9$ and $R^{10}$ are independently of each other H, $C_1$-$C_{18}$alkyl, such as n-butyl, sec-butyl, hexyl, octyl, and 2-ethyl-hexyl, $C_1$-$C_{18}$alkyl which is substituted by E and/or interrupted by D, such as —$CH_2(OCH_2CH_2)_wOCH_3$, w=1, 2, 3, or 4, $C_6$-$C_{24}$aryl, such as phenyl, naphthyl, and biphenyl, $C_6$-$C_{24}$aryl which is substituted by E, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, and —$C_6H_4tBu$, or $R^9$ and $R^{10}$ together form a 4 to 8 membered ring, especially a 5 or 6 membered ring, such as cyclohexyl, or cyclopentyl, which can optionally be substituted by $C_1$-$C_8$alkyl.

Preferably, $R^{14'}$ and $R^{15'}$ are independently of each other H, $C_1$-$C_{18}$alkyl, such as methyl, ethyl, n-propyl, iso-propyl, n-butyl, isobutyl, and sec-butyl, or $C_6$-$C_{24}$aryl, such as phenyl, naphthyl, and biphenyl.

$X^4$ is preferably $C_1$-$C_{18}$alkyl, such as methyl, ethyl, n-propyl, iso-propyl, n-butyl, isobutyl, sec-butyl, t-butyl, hexyl, octyl, and 2-ethyl-hexyl, or $C_6$-$C_{24}$aryl, such as phenyl, naphthyl, and biphenyl, and $X^5$ is preferably $C_1$-$C_{18}$alkyl, such as methyl, ethyl, n-propyl, iso-propyl, n-butyl, isobutyl, sec-butyl, t-butyl, hexyl, octyl, and 2-ethyl-hexyl, or $C_6$-$C_{24}$ aryl, such as phenyl, naphthyl, and biphenyl.

Preferably, $R^{11}$, $R^{12}$ and $R^{13}$ are independently of each other H, $C_1$-$C_{18}$alkyl, such as methyl, and ethyl, $C_1$-$C_{18}$alkyl which is substituted by E and/or interrupted by D, such as —$CH_2OCH_3$, —$CH_2OCH_2CH_3$, —$CH_2OCH_2CH_2OCH_3$, and —$CH_2OCH_2CH_2OCH_2CH_3$, $C_6$-$C_{24}$aryl, such as phenyl, naphthyl, and biphenyl, $C_6$-$C_{24}$aryl which is substituted by E, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, and —$C_6H_4tBu$, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, such as —$OCH_2OCH_3$, —$OCH_2OCH_2CH_3$, $CH_2OCH_2CH_2OCH_3$, —$OCH_2CH_2OCH_3$, —$OCH_2CH_2OCH_2CH_2OCH_3$ and —$OCH_2CH_2OCH_2CH_2OCH_2CH_3$, methoxy, ethoxy, n-propoxy, iso-propoxy, n-butoxy, isobutoxy, sec-butoxy, hexoxy, octoxy, and 2-ethyl-hexyloxy, and $C_7$-$C_{25}$aralkyl.

D is preferably —CO—, —COO—, —S—, —SO—, —$SO_2$—, —O—, —$NR^{25}$—, wherein $R^{25}$ is $C_1$-$C_{18}$ alkyl, such as methyl, ethyl, n-propyl, iso-propyl, n-butyl, isobutyl, sec-butyl, t-butyl, hexyl, octyl, and 2-ethyl-hexyl, or $C_6$-$C_{24}$aryl, such as phenyl, naphthyl, and biphenyl.

E is preferably —$OR^{29}$, —$SR^{29}$, —$NR^{25}R^{25}$, —$COR^{28}$, —$COOR^{27}$, —$CONR^{25}R^{25}$, or —CN, wherein $R^{25}$, $R^{27}$, $R^{28}$ and $R^{29}$ are independently of each other $C_1$-$C_{18}$ alkyl, such as methyl, ethyl, n-propyl, iso-propyl, n-butyl, isobutyl, sec-butyl, hexyl, octyl, 2-ethyl-hexyl, or $C_6$-$C_{24}$ aryl, such as phenyl, naphthyl, and biphenyl.

Preferably, at least one of $R^1$ and $R^2$ is $C_6$-$C_{24}$aryl or $C_2$-$C_{20}$heteroaryl, which optionally can be substituted. In this case, $R^1$ and $R^2$ are preferably selected from

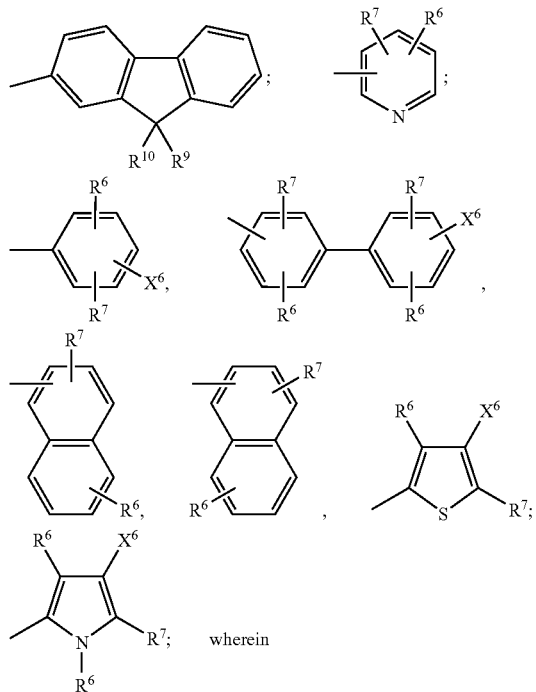

$R^6$, $R^7$ and $X^6$ are independently of each other H, $C_1$-$C_{18}$ alkyl, such as methyl, ethyl, n-propyl, iso-propyl, n-butyl, isobutyl, sec-butyl, t-butyl, hexyl, octyl, 2-ethyl-hexyl, $C_1$-$C_{18}$alkyl which is substituted by E and/or interrupted by D, such as —$CH_2OCH_3$, —$CH_2OCH_2CH_3$, —$CH_2OCH_2CH_2OCH_3$, and —$CH_2OCH_2CH_2OCH_2CH_3$, $C_6$-$C_{24}$ aryl, such as phenyl, naphthyl, and biphenyl, $C_6$-$C_{24}$ aryl which is substituted by E, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, and —$C_6H_4tBu$, $R^8$ is H, $C_1$-$C_{18}$ alkyl, such as methyl, ethyl, n-propyl, iso-propyl, n-butyl, isobutyl, and sec-butyl, or $C_6$-$C_{24}$ aryl, such as phenyl, naphthyl, and biphenyl, and $R^9$ and $R^{10}$ are independently of each other H, $C_1$-$C_{18}$alkyl, such as n-butyl, sec-butyl, hexyl, octyl, or 2-ethyl-hexyl, $C_1$-$C_{18}$alkyl which is substituted by E and/or interrupted by D, such as —$CH_2(OCH_2CH_2)_wOCH_3$, w=1, 2, 3, or 4, $C_6$-$C_{24}$aryl, such as phenyl, naphthyl, or biphenyl, $C_6$-$C_{24}$aryl which is substituted by E, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, or —$C_6H_4tBu$, or $R^9$ and $R^{10}$ together form a 4 to 8 membered ring, especially a 5 or 6 membered ring, such as cyclohexyl, or cyclopentyl.

Most preferred, $R^2$ is H and $R^1$ is $C_6$-$C_{24}$aryl or $C_2$-$C_{20}$heteroaryl in formula Ia and Ib.

The polymer of the present invention comprise the repeating unit of the formula I in an amount of from 0.5 mol % to 100 mol %, especially in an amount of from 40 mol % to 60 mol %, wherein the sum of all repeating units (monomers) is 100 mol %. Accordingly, the polymers of the present invention can comprise besides the repeating unit of the formula I co-momers in an amount of up to 99.5 mol %, especially in an amount of from 60 mol % to 40 mol %.

In a preferred embodiment of the present invention the polymers are homopolymers, which comprise a repeating unit of formula

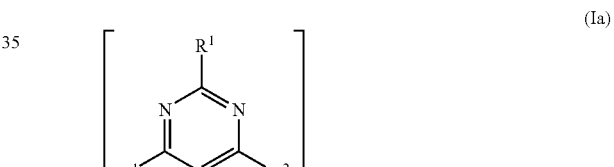 (Ia)

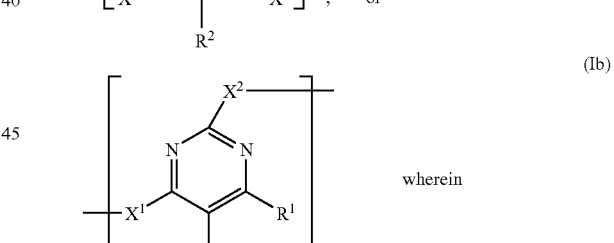 (Ib)

wherein $R^1$ is a group of formula

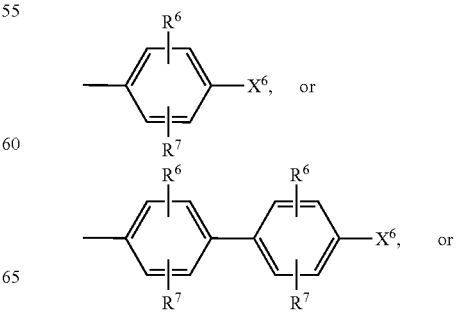

-continued
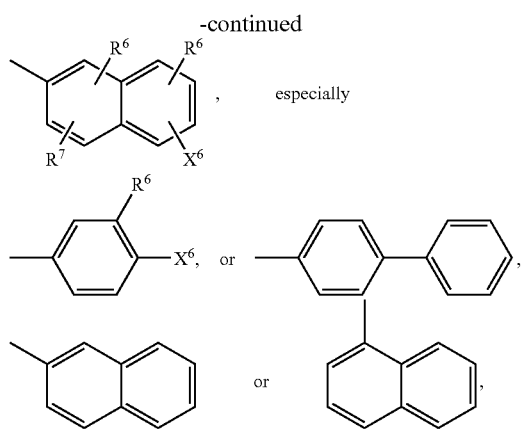
wherein $X^6$ is H, $C_1$-$C_{16}$alkyl, cyclohexyl, or $C_1$-$C_{18}$alkoxy,
$R^2$ is H,
$X^1$ and $X^2$ are independently of each other a group of formula
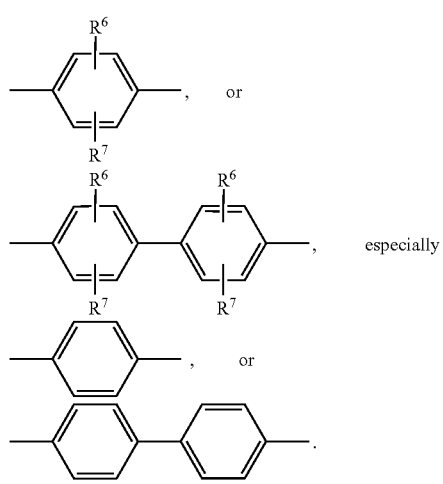
The present polymer is not a polymer of formula
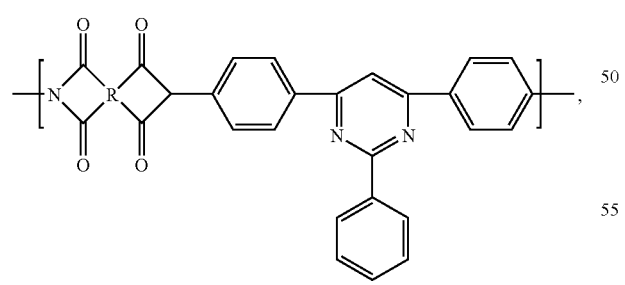
wherein R is a group of formula
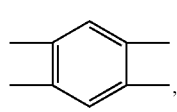
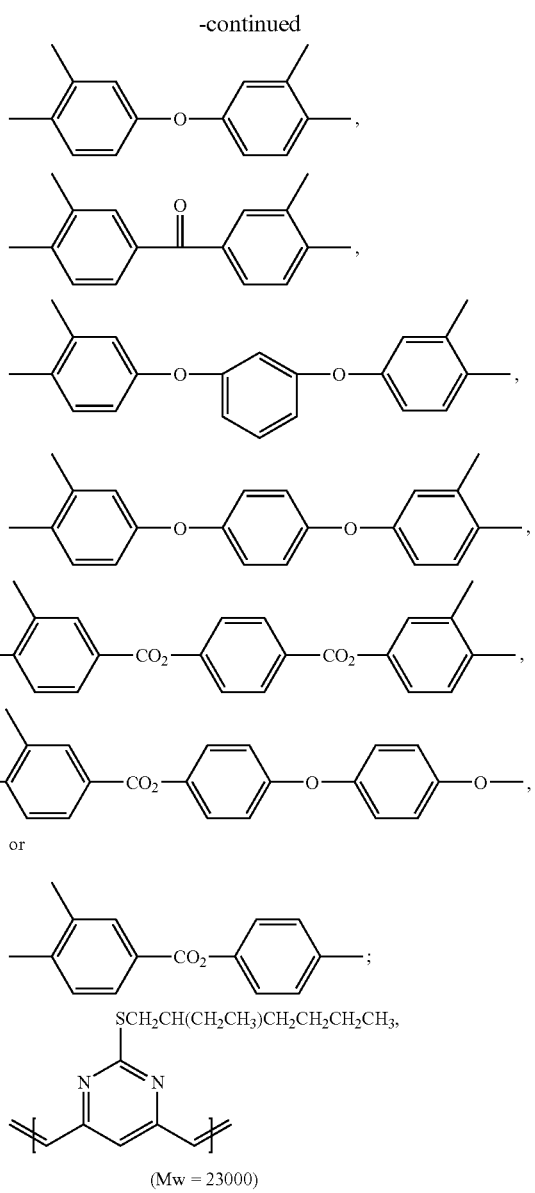
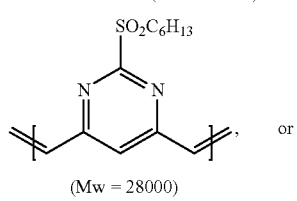
(Mw = 28000)
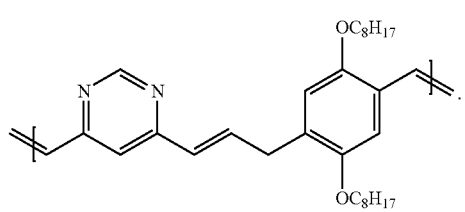
Mw = 4300
Preferably, the present polymers do not comprise repeating units of formula

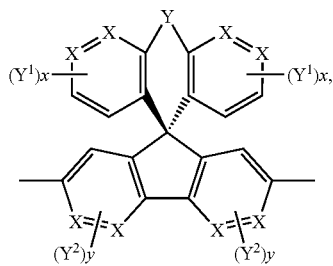
wherein X(=X), Y(=Z), Y¹(=R¹), Y²(=R²), x(=n) and y(=m) are as defined in DE-A-10143353.
Suitable co-monomers T are selected from the group consisting of
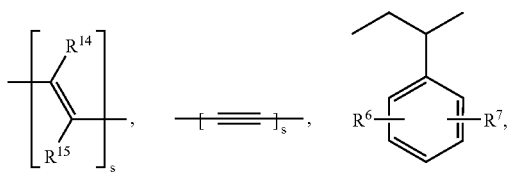
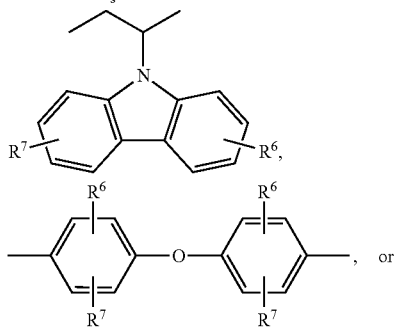
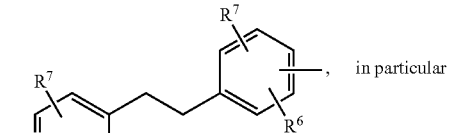
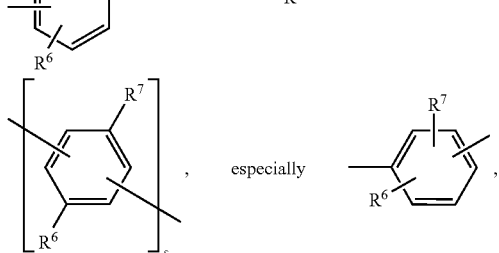
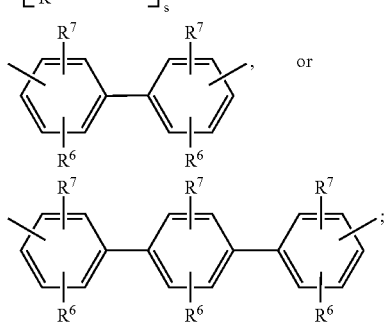
-continued
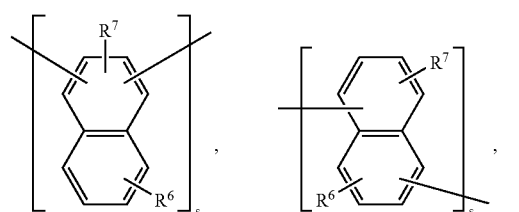
especially
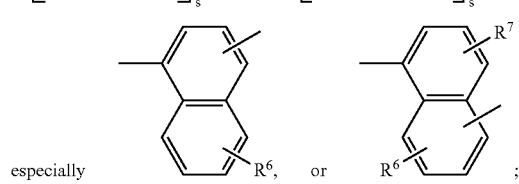
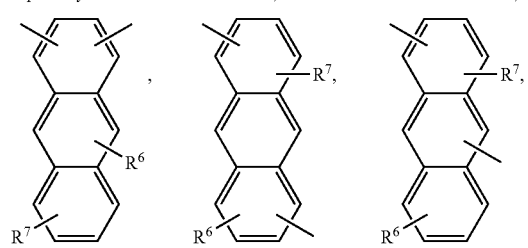
especially
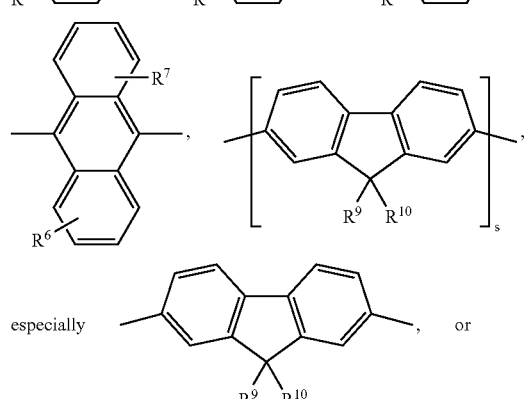
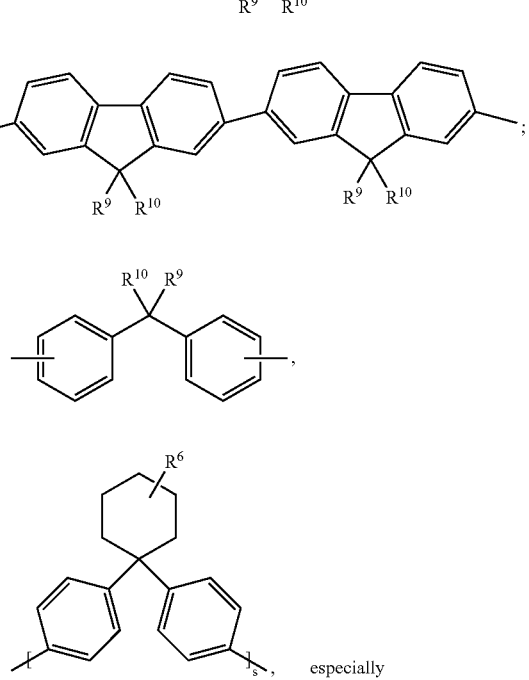
especially -continued

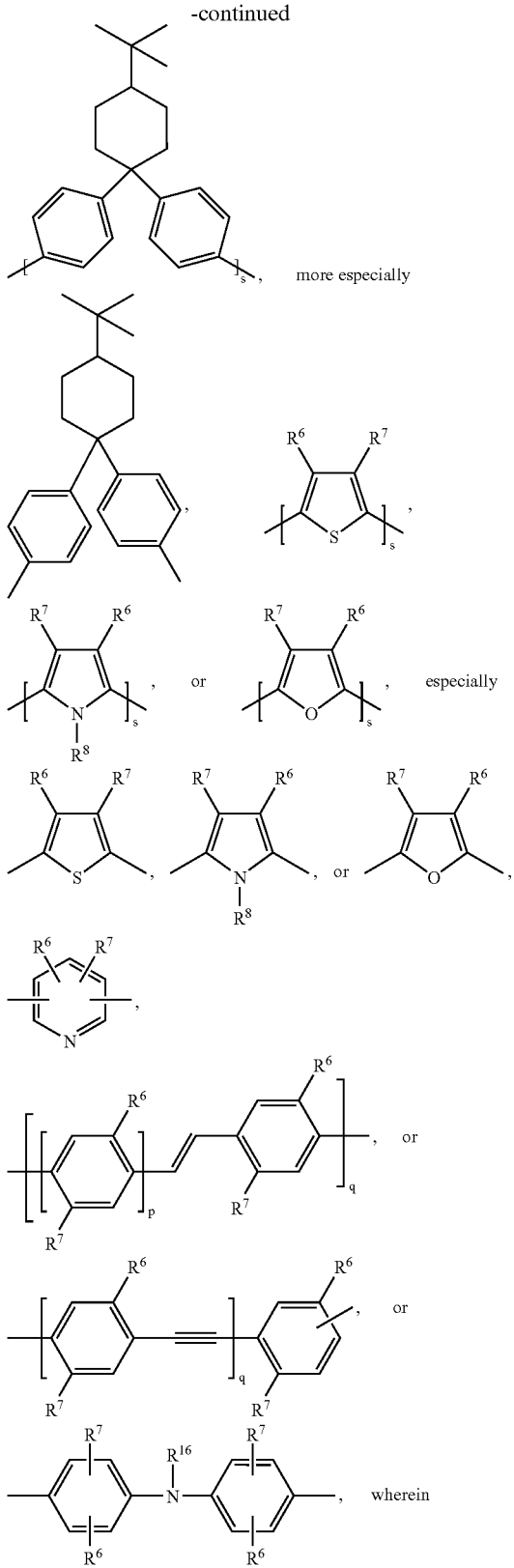

$R^{16}$ is H; $C_6$-$C_{18}$aryl, $C_6$-$C_{18}$aryl which is substituted by $C_1$-$C_{18}$alkyl, $C_1$-$C_{18}$alkyl, $C_7$-$C_{25}$aralkyl, or $C_1$-$C_{18}$alkyl which is interrupted by —O—;

p is an integer from 1 to 10, especially 1, 2 or 3,
q is an integer from 1 to 10, especially 1, 2 or 3,
s is an integer from 1 to 10, especially 1, 2 or 3,
$R^6$, $R^7$, $R^8$, $R^9$ and $R^{10}$ are as defined above, or
$R^9$ and $R^{10}$ together form a group of formula $=CR^{100}R^{101}$, wherein
$R^{100}$ and $R^{101}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{20}$heteroaryl, or $C_2$-$C_{20}$heteroaryl which is substituted by E, and
$R^{14}$ and $R^{15}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{20}$heteroaryl, or $C_2$-$C_{20}$heteroaryl which is substituted by E.

If $R^9$ and $R^{10}$ together form a group of formula $=CR^{100}R^{101}$, T is preferably a group of formula

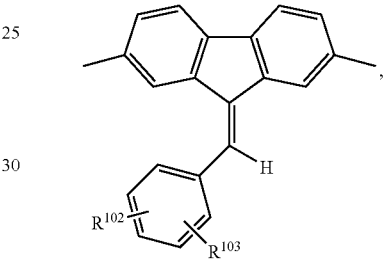

wherein $R^{102}$ and $R^{103}$ are independently of each other $C_1$-$C_{18}$alkyl, $C_1$-$C_{18}$alkoxy, $C_6$-$C_{10}$aryl, $C_6$-$C_{10}$aryloxy, or di($C_1$-$C_{18}$alkyl)amino, wherein the aryl or aryloxy groups optionally can be substituted by $C_1$-$C_8$alkyl (cf. U.S. Pat. No. 6,512,083).

Preferred examples of T are selected from groups of formula

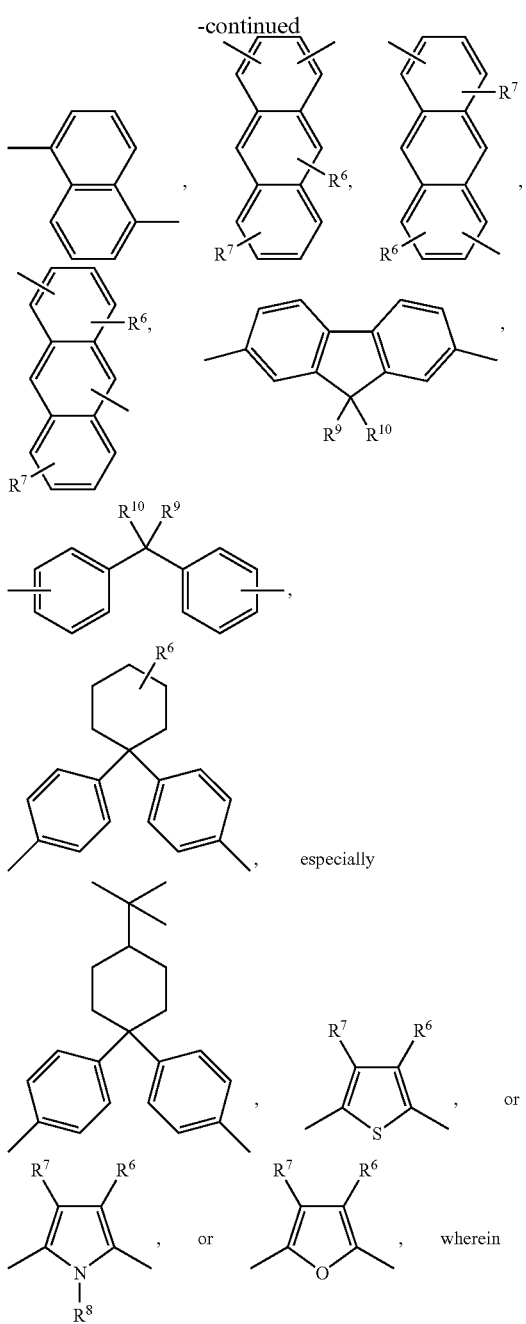

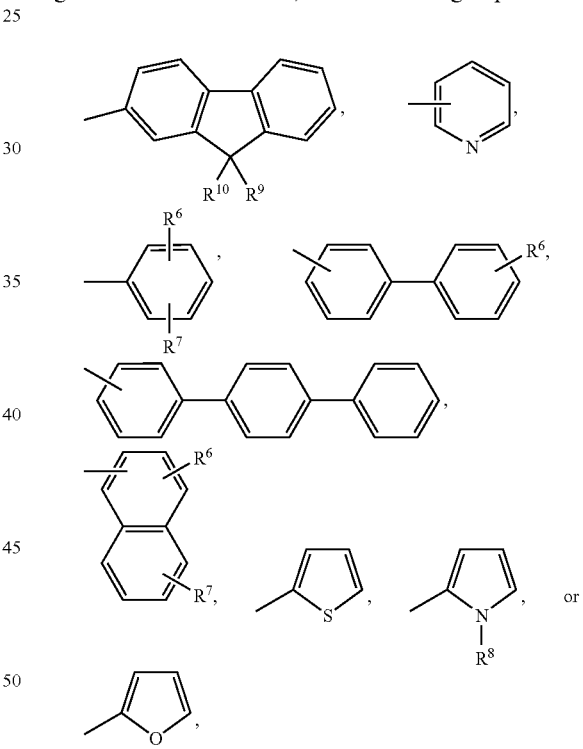

n-pentyl, isopentyl, n-hexyl, 2-ethylhexyl, n-heptyl, or $C_6$-$C_{24}$aryl, such as phenyl, naphthyl, or biphenyl, and $R^9$ and $R^{10}$ are independently H, $C_1$-$C_{18}$alkyl, such as n-butyl, sec-butyl, hexyl, octyl, or 2-ethyl-hexyl, $C_1$-$C_{18}$alkyl which is substituted by E and/or interrupted by D, such as —$CH_2(OCH_2CH_2)_wOCH_3$, w=1, 2, 3, or 4, $C_6$-$C_{24}$aryl, such as phenyl, naphthyl, or biphenyl, $C_6$-$C_{24}$aryl which is substituted by E, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, or —$C_6H_4tBu$, or $R^9$ and $R^{10}$ together form a 4 to 8 membered ring, especially a 5 or 6 membered ring, such as cyclohexyl, or cyclopentyl, which may be substituted with $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, or n-heptyl, $C_1$-$C_{18}$alkyl which is substituted by E and/or interrupted by D, such as —$CH_2OCH_3$, —$CH_2OCH_2CH_3$, —$CH_2OCH_2CH_2OCH_3$, or —$CH_2OCH_2CH_2OCH_2CH_3$, $C_6$-$C_{24}$aryl, such as phenyl, naphthyl, or biphenyl, $C_6$-$C_{24}$aryl which is substituted by E, such as —$C_6H_4OCH_3$, —$C_6H_4OCH_2CH_3$, —$C_6H_3(OCH_3)_2$, or —$C_6H_4CH_3$, —$C_6H_3(CH_3)_2$, —$C_6H_2(CH_3)_3$, or —$C_6H_4tBu$.

In a preferred embodiment the polymers comprise repeating units of formula Ia or Ib, wherein $R^1$ is a group of formula $R^6$ and $R^7$ are independently of each other H, $C_1$-$C_{18}$ alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, or n-heptyl, $C_1$-$C_{18}$alkyl which is substituted by E and/or interrupted by D, such as —$CH_2OCH_3$, —$CH_2OCH_2CH_3$, —$CH_2OCH_2CH_2OCH_3$, or —$CH_2OCH_2CH_2OCH_2CH_3$, $C_5$-$C_{12}$cycloalkyl, such as cyclohexyl, $C_6$-$C_{24}$aryl, such as phenyl, naphthyl, or biphenyl, $C_6$-$C_{24}$aryl which is substituted by E, such as —$C_6H_4OCH_3$, —$C_6H_4OCH_2CH_3$, —$C_6H_3(OCH_3)_2$, or —$C_6H_3(OCH_2CH_3)_2$, —$C_6H_4CH_3$, —$C_6H_3(CH_3)_2$, —$C_6H_2(CH_3)_3$, or —$C_6H_4tBu$, $R^8$ is H, $C_1$-$C_{18}$alkyl, such as methyl, ethyl, n-propyl, iso-propyl, n-butyl, isobutyl, sec-butyl, t-butyl, 2-methylbutyl, $R^2$ is H, $R^6$ and $R^7$ are independently of each other H, $C_1$-$C_{12}$alkyl, cyclohexyl, or $C_1$-$C_{12}$alkoxy, $R^8$ is $C_1$-$C_{18}$alkyl, $C_1$-$C_{18}$alkyl interrupted by one or two oxygen atoms, or $C_6$-$C_{12}$aryl, which optionally can be substituted by $C_1$-$C_{12}$alkyl, or $C_1$-$C_{12}$alkoxy, $R^9$ and $R^{10}$ are independently of each other $C_1$-$C_{18}$alkyl, especially $C_4$-$C_{12}$alkyl, which can be interrupted by one or two oxygen atoms, and $X^1$, $X^2$, T, x and y are as defined above.

In said embodiment a co-monomer T can optionally be present, which is preferably selected from the group consisting of

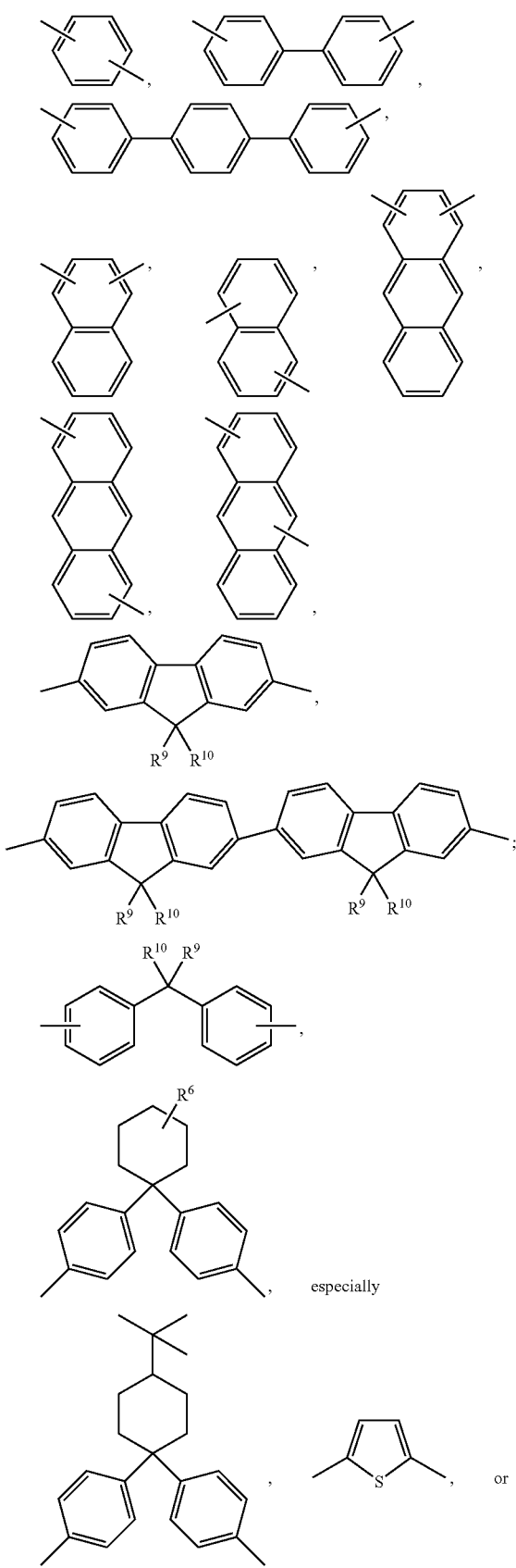

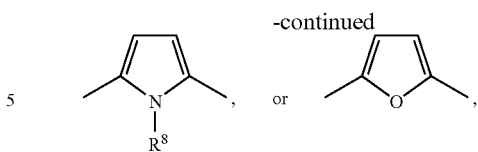

wherein $R^6$ is H, or $C_1$-$C_8$alkyl, $R^8$ is $C_1$-$C_{18}$alkyl, $R^9$ and $R^{10}$ are independently of each other $C_1$-$C_{18}$alkyl, especially $C_4$-$C_{12}$alkyl, which can be interrupted by one or two oxygen atoms, or $R^9$ and $R^{10}$ form a five or six membered carbocyclic ring, which optionally can be substituted by $C_1$-$C_8$alkyl.

In the first aspect of the present invention polymers are particularly preferred, which comprise a repeating unit of formula

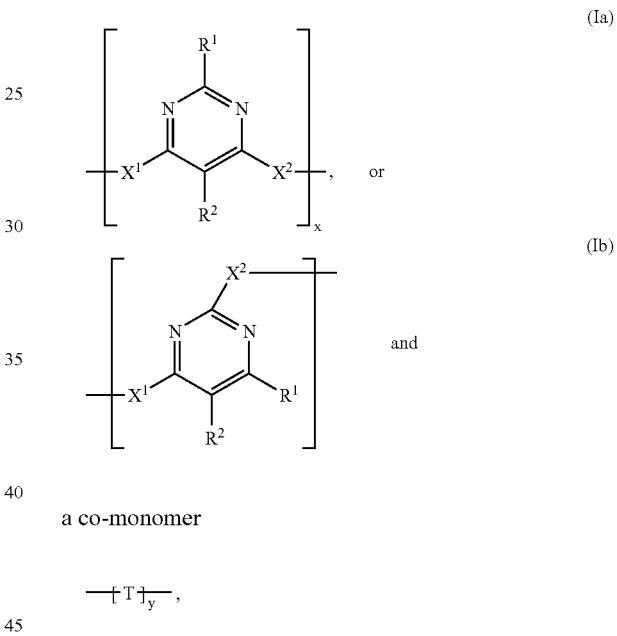

a co-monomer $$-\!\!\!-\!\!(T)_y\!\!-\!\!\!-,$$

wherein x is in the range of 0.005 to 1, especially 0.4 to 0.6, and y is in the range of 0.995 to 0, especially 0.6 to 0.4, wherein the sum of x and y is 1, $R^1$ is a group of formula

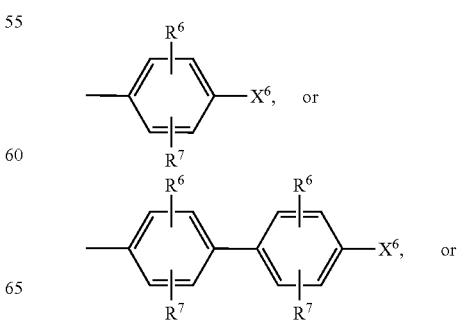

-continued

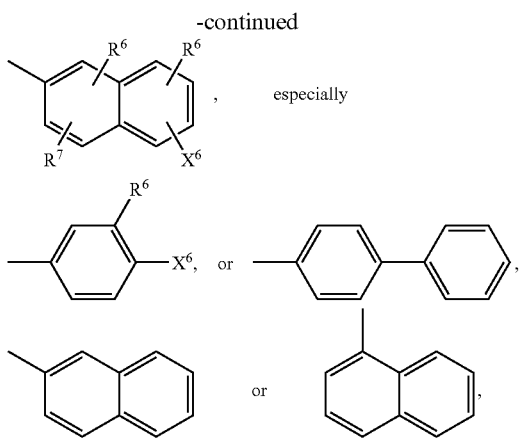
, especially wherein $X^6$ is H, $C_1$-$C_{18}$alkyl, cyclohexyl, or $C_1$-$C_{18}$alkoxy, $R^2$ is H, $X^1$ and $X^2$ are independently of each other a group of formula

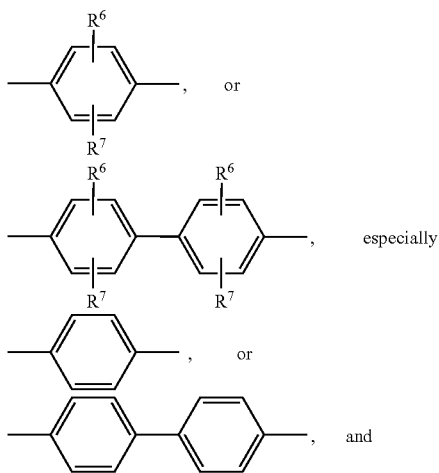

T is a group of formula

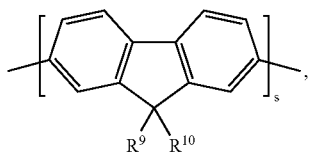

wherein s is one or two, and $R^9$ and $R^{10}$ are independently of each other $C_1$-$C_{18}$alkyl, especially $C_4$-$C_{12}$alkyl, which can be interrupted by one or two oxygen atoms, and $R^6$ and $R^7$ are independently of each other H, $C_1$-$C_{12}$alkyl, cyclohexyl, $C_6$-$C_{24}$aryl, especially phenyl, naphthyl, or biphenyl, which can be substituted by —O—$C_1$-$C_{12}$alkyl, or $C_1$-$C_{18}$alkoxy.

In a second aspect, the present invention relates to polymers comprising a repeating unit of the formula

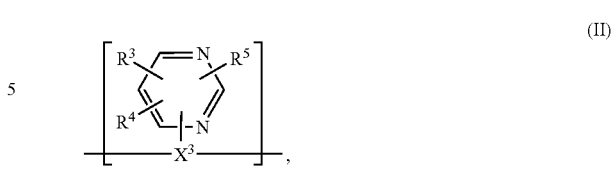

wherein $R^3$, $R^4$ and $R^5$ are independently of each other an organic substituent, especially $C_2$-$C_{30}$aryl or a $C_2$-$C_{26}$heteroaryl, which optionally can be substituted, $X^3$ is a divalent linking group, wherein repeating units of the formula

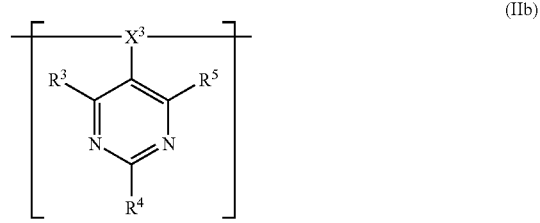

are preferred and repeating units of the formula

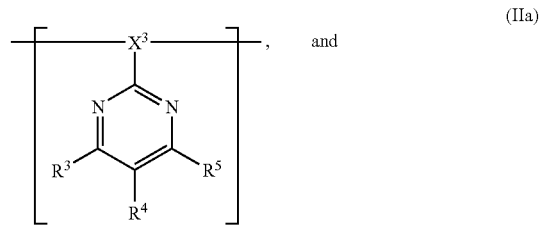
, and

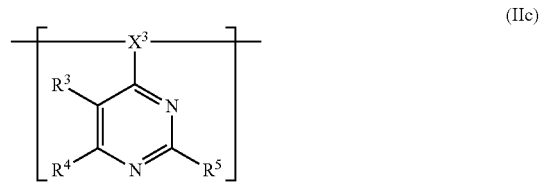

are especially preferred.

Examples of suitable divalent linking groups $X^3$ are

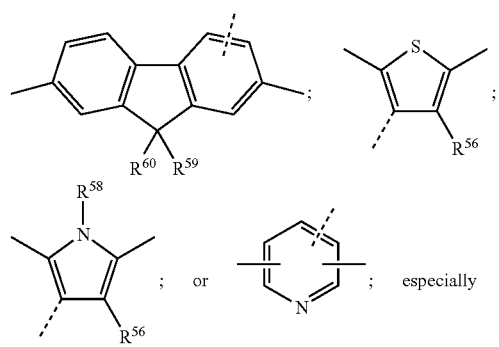
; especially

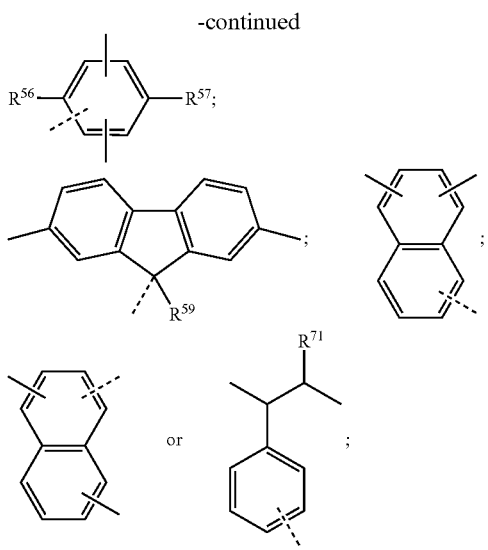

wherein the dotted line represent the bond to the pyrimidine ring;

$R^3$; $R^4$ and $R^5$ are as defined above;

$R^{58}$ and $R^{57}$ are independently of each other H; $C_1$-$C_{18}$alkyl; $C_1$-$C_{18}$alkyl which is substituted by E and/or interrupted by D; $C_5$-$C_{12}$cycloalkyl, $C_5$-$C_{12}$cycloalkyl, which is substituted by E, $C_6$-$C_{24}$aryl; $C_6$-$C_{24}$aryl which is substituted by E; $C_2$-$C_{20}$heteroaryl; $C_2$-$C_{20}$heteroaryl which is substituted by E; $C_2$-$C_{18}$alkenyl; $C_2$-$C_{18}$alkynyl; $C_1$-$C_{18}$alkoxy; $C_1$-$C_{18}$alkoxy which is substituted by E and/or interrupted by D; or $C_7$-$C_{25}$aralkyl;

$R^{58}$ is H; $C_1$-$C_{18}$alkyl; $C_1$-$C_{18}$alkyl which is substituted by E and/or interrupted by D; $C_6$-$C_{24}$aryl; or $C_7$-$C_{25}$aralkyl;

$R^{59}$ is H; $C_1$-$C_{18}$alkyl; $C_1$-$C_{18}$alkyl which is substituted by E and/or interrupted by D; $C_6$-$C_{24}$aryl; $C_6$-$C_{24}$aryl which is substituted by E; $C_2$-$C_{20}$heteroaryl; $C_2$-$C_{20}$heteroaryl which is substituted by E; $C_2$-$C_{18}$alkenyl; $C_2$-$C_{18}$alkynyl; $C_1$-$C_{18}$alkoxy; $C_1$-$C_{18}$alkoxy which is substituted by E and/or interrupted by D; or $C_7$-$C_{25}$aralkyl;

$R^{71}$ is H, $C_1$-$C_{18}$alkyl, —C≡N, —CONR$^{25}$R$^{26}$ or —COOR$^{27}$,

D is —CO—; —COO—; —OCOO—; —S—; —SO—; —SO$_2$—; —O—; —NR$^{25}$—; —SiR$^{30}$R$^{31}$—; —POR$^{32}$—; —CR$^{23}$=CR$^{24}$—; or —C≡C—; and E is —OR$^{29}$; —SR$^{29}$; —NR$^{25}$R$^{26}$; —COR$^{28}$; —COOR$^{27}$; —CONR$^{25}$R$^{26}$; —CN; —OCOOR$^{27}$; or halogen; wherein $R^{23}$; $R^{24}$; $R^{25}$ and $R^{26}$ are independently of each other H; $C_6$-$C_{18}$aryl; $C_6$-$C_{18}$aryl which is substituted by $C_1$-$C_{18}$alkyl; $C_1$-$C_{18}$alkoxy; $C_1$-$C_{18}$alkyl; or $C_1$-$C_{18}$alkyl which is interrupted by —O—; or $R^{25}$ and $R^{26}$ together form a five or six membered ring, in particular

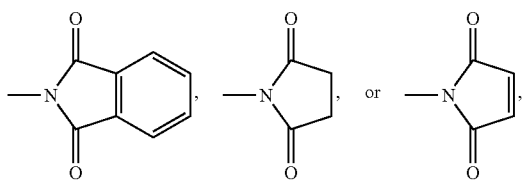

$R^{27}$ and $R^{28}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, and $R^{29}$ is H; $C_6$-$C_{18}$aryl; $C_6$-$C_{18}$aryl which is substituted by $C_1$-$C_{18}$alkyl, $C_1$-$C_{18}$alkoxy; $C_1$-$C_{18}$alkyl; or $C_1$-$C_{18}$alkyl which is interrupted by —O—, $R^{30}$ and $R^{31}$ are independently of each other $C_1$-$C_{18}$alkyl, $C_6$-$C_{18}$aryl, or $C_6$-$C_{18}$aryl, which is substituted by $C_1$-$C_{18}$alkyl, and $R^{32}$ is $C_1$-$C_{18}$alkyl, $C_6$-$C_{18}$aryl, or $C_6$-$C_{18}$aryl, which is substituted by $C_1$-$C_{18}$alkyl.

In the second aspect of the present invention polymers comprising a repeating unit of formula IIb, especially a repeating unit of formula IIa, or IIc are preferred, wherein $X^3$ is a group of the formula

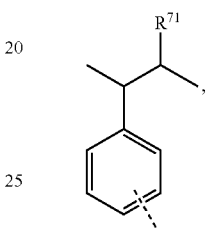

wherein the dotted line represent the bond to the pyrimidine ring and $R^{71}$ is H, alkyl, —C≡N, or —COOR$^{27}$, wherein $R^{27}$ is H, or $C_1$-$C_{18}$alkyl, which optionally can be interrupted by one or more oxygen atoms, especially $C_4$-$C_{12}$alkyl, which can be interrupted by one or two oxygen atoms.

$R^3$, $R^4$ and $R^5$ can in principal be any organic substituent, provided it does not have negative influence on the (electro) luminescent characteristics of the polymers, especially H, $C_1$-$C_{18}$alkyl, $C_1$-$C_{18}$alkyl which is substituted by E and/or interrupted by D, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl,

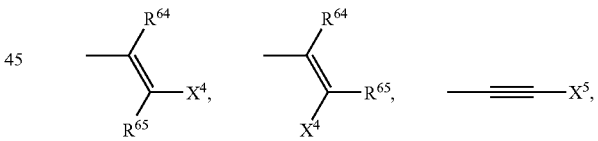

$C_6$-$C_{24}$aryl, or $C_2$-$C_{20}$heteroaryl, which optionally can be substituted, especially a group of the formula

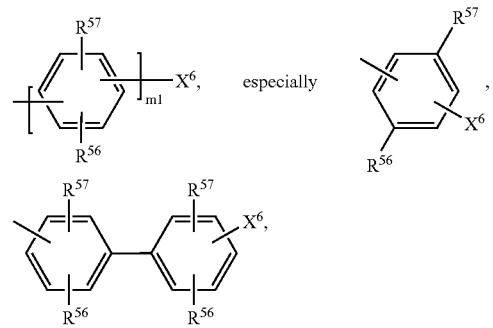

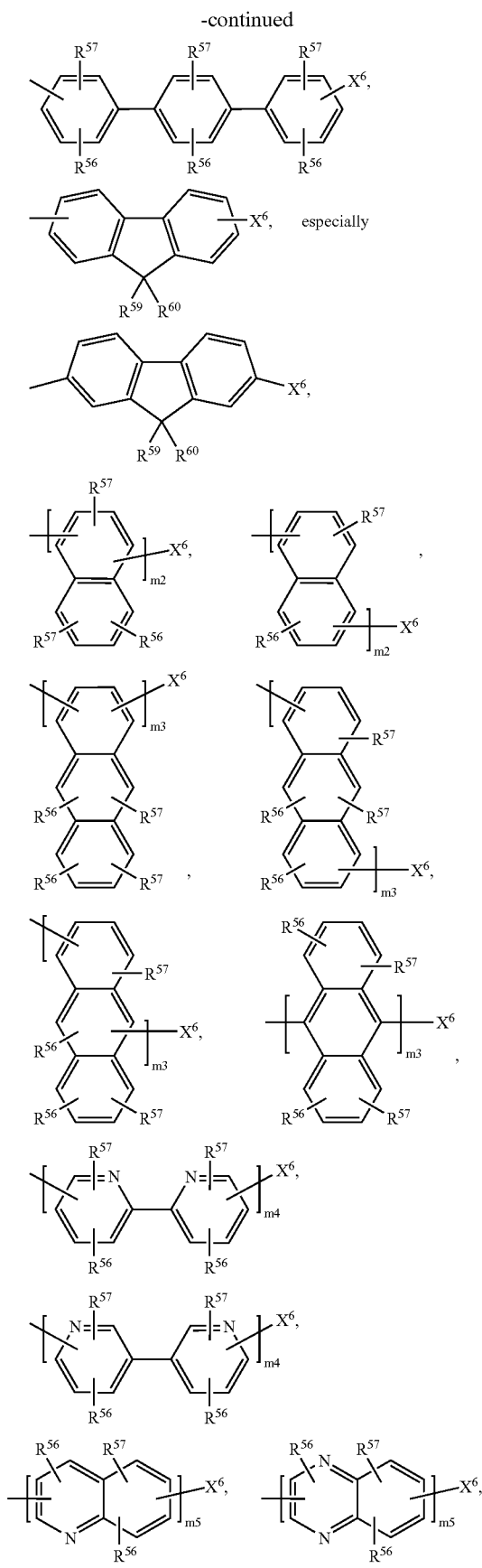

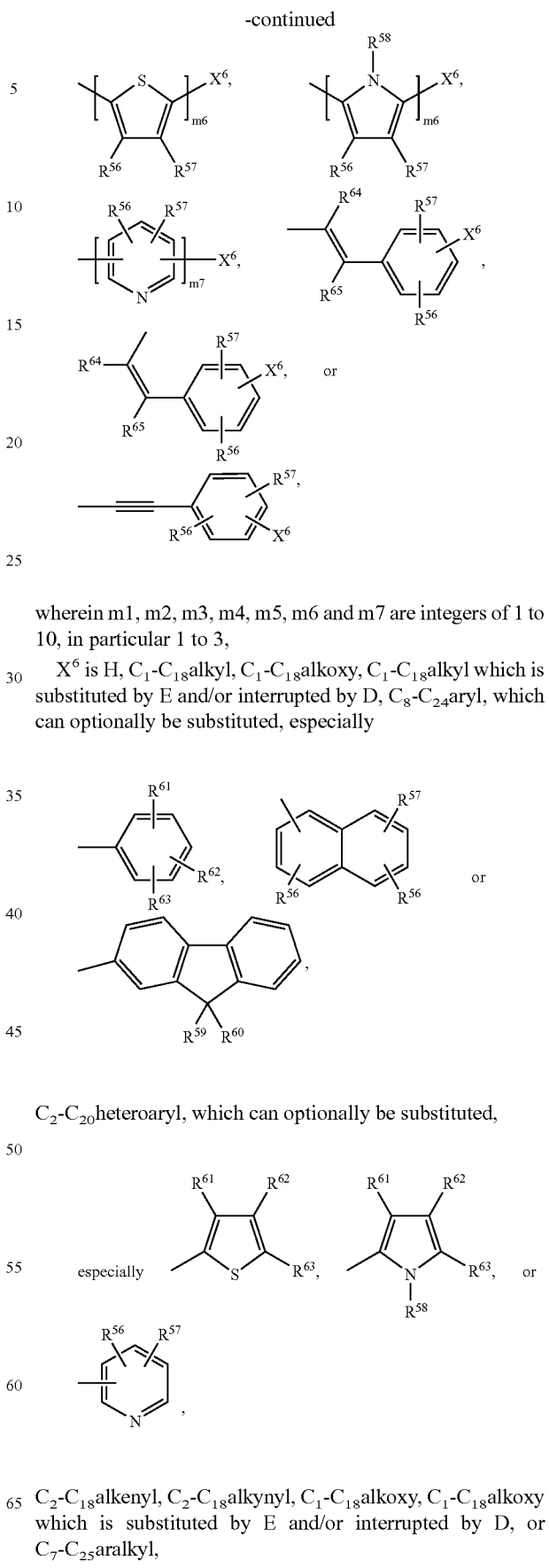

wherein m1, m2, m3, m4, m5, m6 and m7 are integers of 1 to 10, in particular 1 to 3, $X^6$ is H, $C_1$-$C_{18}$alkyl, $C_1$-$C_{18}$alkoxy, $C_1$-$C_{18}$alkyl which is substituted by E and/or interrupted by D, $C_8$-$C_{24}$aryl, which can optionally be substituted, especially $C_2$-$C_{20}$heteroaryl, which can optionally be substituted, especially $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, $X^4$ is $C_1$-$C_{18}$alkyl, $C_1$-$C_{18}$alkyl which is substituted by E and/or interrupted by D, $C_6$-$C_{24}$aryl or $C_2$-$C_{20}$heteroaryl, which can optionally be substituted, $X^5$ is $C_1$-$C_{18}$alkyl, $C_6$-$C_{24}$aryl, or $C_2$-$C_{20}$heteroaryl, which can optionally be substituted by —$OC_1$-$C_{18}$alkyl or —$OC_6$-$C_{24}$aryl, $R^{61}$, $R^{62}$ and $R^{63}$ are independently of each other H, $C_1$-$C_{18}$ alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, $R^{64}$ and $R^{65}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{20}$heteroaryl, or $C_2$-$C_{20}$heteroaryl which is substituted by E, and D, E, $R^{56}$, $R^{57}$, $R^{58}$, $R^{59}$ and $R^{60}$ are as defined above.

Preferably, $R^{56}$ and $R^{57}$ are independently of each other H, $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, and n-heptyl, $C_1$-$C_{18}$alkyl, which is substituted by E and/or interrupted by D, such as —$CH_2OCH_3$, —$CH_2OCH_2CH_3$, —$CH_2OCH_2CH_2OCH_3$, and —$CH_2OCH_2CH_2OCH_2CH_3$, $C_5$-$C_{12}$cycloalkyl, such as cyclohexyl, $C_6$-$C_{24}$aryl, such as phenyl, naphthyl, and biphenyl, or $C_6$-$C_{24}$aryl, which is substituted by E, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, and —$C_6H_4tBu$.

$R^{58}$ is preferably H, $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, and n-heptyl, or $C_6$-$C_{24}$aryl, such as phenyl, naphthyl, and biphenyl.

Preferably, $R^{59}$ and $R^{60}$ are independently of each other H, $C_1$-$C_{18}$alkyl, such as n-butyl, sec-butyl, hexyl, octyl, and 2-ethyl-hexyl, $C_1$-$C_{18}$alkyl which is substituted by E and/or interrupted by D, such as —$CH_2(OCH_2CH_2)_wOCH_3$, w=1, 2, 3, or 4, $C_6$-$C_{24}$aryl, such as phenyl, naphthyl, and biphenyl, $C_6$-$C_{24}$ aryl which is substituted by E, such as —$C_6H_4OCH_3$, —$C_6H_4OCH_2CH_3$, —$C_6H_3(OCH_3)_2$, —$C_6H_3(OCH_2CH_3)_2$, —$C_6H_4CH_3$, —$C_6H_3(CH_3)_2$, —$C_6H_2(CH_3)_3$, and —$C_6H_4tBu$, or $R^{59}$ and $R^{60}$ together form a 4 to 8 membered ring, preferably a 5 or 6 membered ring, such as cyclohexyl, and cyclopentyl.

Preferably, $R^{64}$ and $R^{65}$ are independently of each other H, $C_1$-$C_{18}$alkyl, such as methyl, ethyl, n-propyl, iso-propyl, n-butyl, isobutyl, and sec-butyl, or $C_6$-$C_{24}$aryl, such as phenyl, naphthyl, and biphenyl.

$X^4$ is preferably $C_1$-$C_{18}$alkyl, such as methyl, ethyl, n-propyl, iso-propyl, n-butyl, isobutyl, sec-butyl, t-butyl, hexyl, octyl, and 2-ethyl-hexyl, or $C_6$-$C_{24}$aryl, such as phenyl, naphthyl, and biphenyl.

$X^5$ is preferably $C_1$-$C_{18}$alkyl, such as methyl, ethyl, n-propyl, iso-propyl, n-butyl, isobutyl, sec-butyl, t-butyl, hexyl, octyl, and 2-ethyl-hexyl, $C_6$-$C_{24}$aryl, such as phenyl, naphthyl, and biphenyl, or $C_6$-$C_{24}$aryl substituted by $OR^{29}$, wherein $R^{29}$ is H, $C_1$-$C_{18}$ alkyl, such as methyl, and ethyl, or $C_6$-$C_{24}$ aryl, such as phenyl.

D is preferably —CO—; —COO—; —OCOO—; —S—; —SO—; —$SO_2$—; —O—; —$NR^{25}$—; and E is preferably —$OR^{29}$; —$SR^{29}$; —$NR^{25}R^{26}$; —$COR^{28}$; —$COOR^{27}$; —$CONR^{25}R^{26}$; or —CN; wherein $R^{25}$; $R^{27}$; $R^{28}$ and $R^{29}$ are independently of each other H; $C_1$-$C_{18}$alkyl; such as methyl; ethyl; n-propyl; iso-propyl; n-butyl; isobutyl; sec-butyl; hexyl; octyl; and 2-ethyl-hexyl; $C_6$-$C_{24}$aryl; such as phenyl; naphthyl; and biphenyl.

Preferably, at least one of $R^1$, $R^2$ and $R^3$ is $C_6$-$C_{24}$aryl or $C_2$-$C_{20}$heteroaryl, which optionally can be substituted. In this aspect, polymers comprising repeating units of formula IIa, wherein $R^4$ is H and $R^3$ and $R^5$ are independently of each other $C_6$-$C_{24}$aryl, or $C_2$-$C_{20}$heteroaryl, or IIc, wherein $R^3$ is H and $R^4$ and $R^5$ are independently of each other $C_6$-$C_{24}$aryl or $C_2$-$C_{20}$heteroaryl, are preferred against those polymers having repeating units of formula IIb, wherein $R^3$, $R^4$, and $R^5$ are independently of each other $C_6$-$C_{24}$aryl or $C_2$-$C_{20}$heteroaryl, wherein the $C_6$-$C_{24}$aryl or $C_2$-$C_{20}$heteroaryl can optionally be substituted.

Preferably, $R^3$, $R^4$, and $R^5$ are independently of each other H,

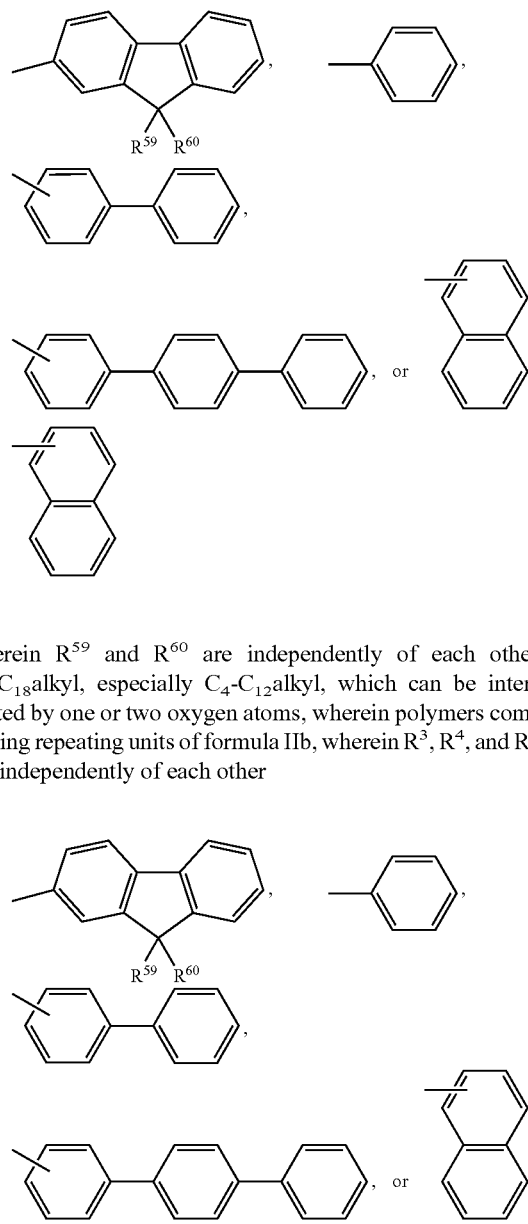

wherein $R^{59}$ and $R^{60}$ are independently of each other $C_1$-$C_{18}$alkyl, especially $C_4$-$C_{12}$alkyl, which can be interrupted by one or two oxygen atoms, wherein polymers comprising repeating units of formula IIb, wherein $R^3$, $R^4$, and $R^5$ are independently of each other

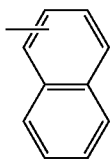

-continued and polymers comprising repeating units of formula (IIa), wherein $R^4$ is H and $R^3$ and $R^5$ are independently of each other

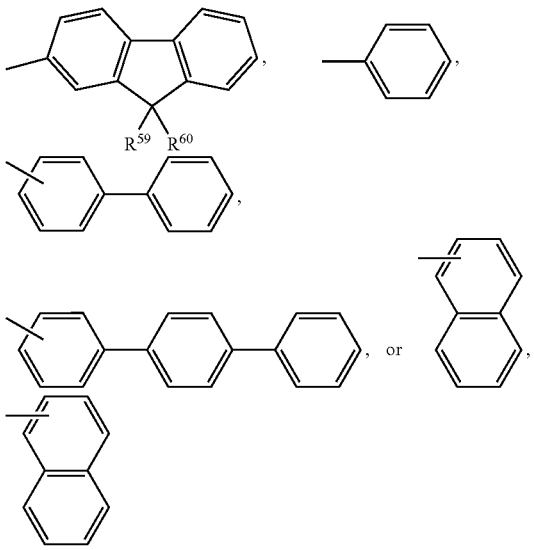

and polymers comprising repeating units of formula (IIc), wherein $R^3$ is H and $R^4$ and $R^5$ are independently of each other

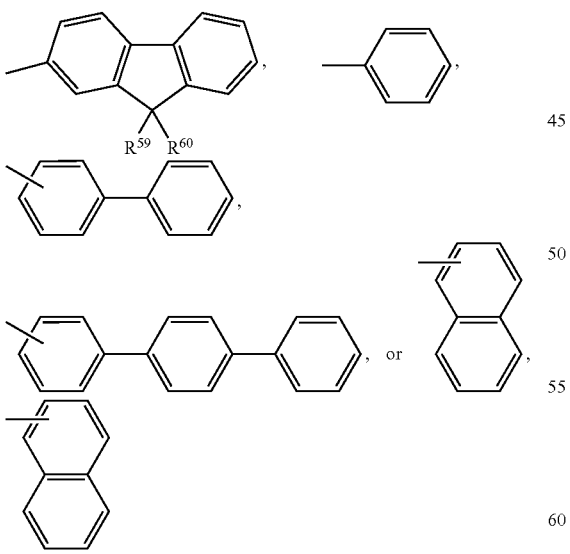

are especially preferred.

The polymers of the present invention comprise the repeating unit of the formula II in an amount of from 0.5 mol % to 100 mol %, especially in an amount of from 40 mol % to 60 mol %, wherein the sum of all repeating units (monomers) is 100 mol %. Accordingly, the polymers of the present invention can comprise besides the repeating unit of the formula II co-momers in an amount of up to 99.5 mol %, especially in an amount of from 60 mol % to 40 mol %.

Suitable co-monomers T are selected from the group consisting of

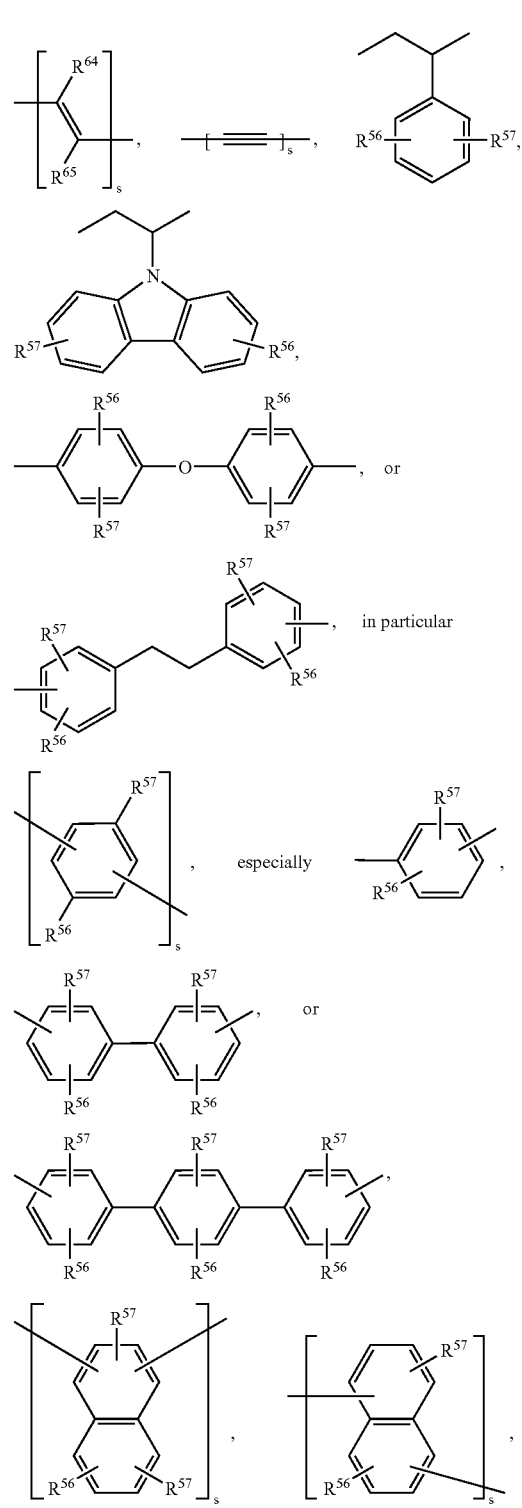

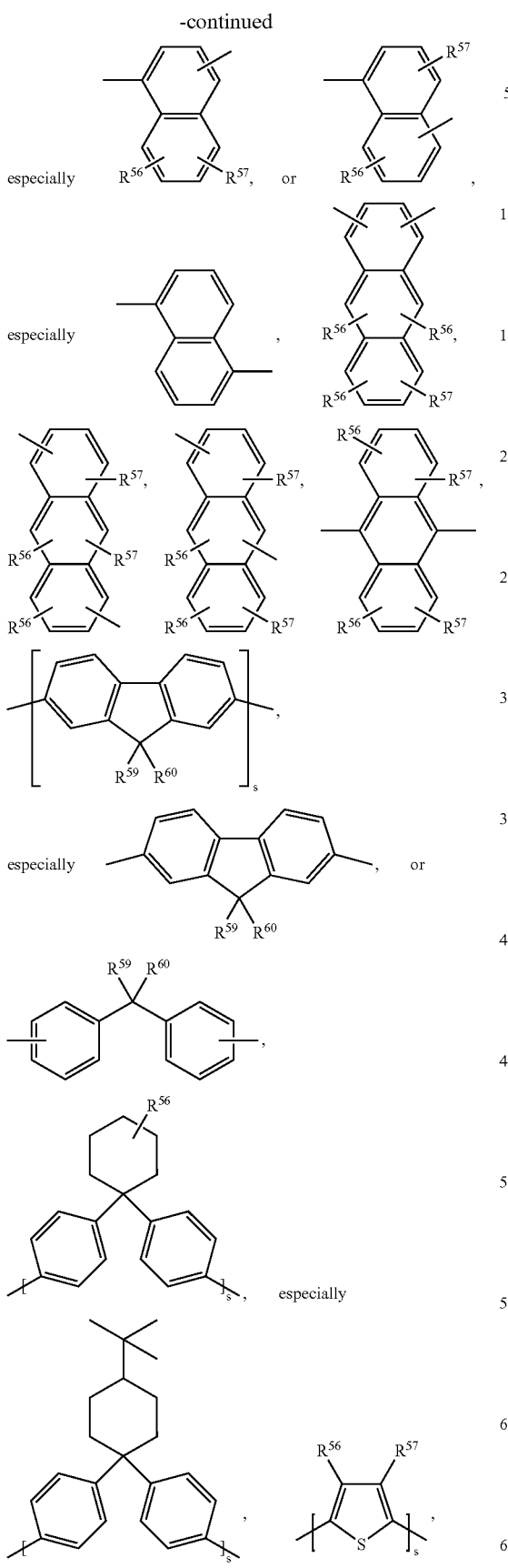
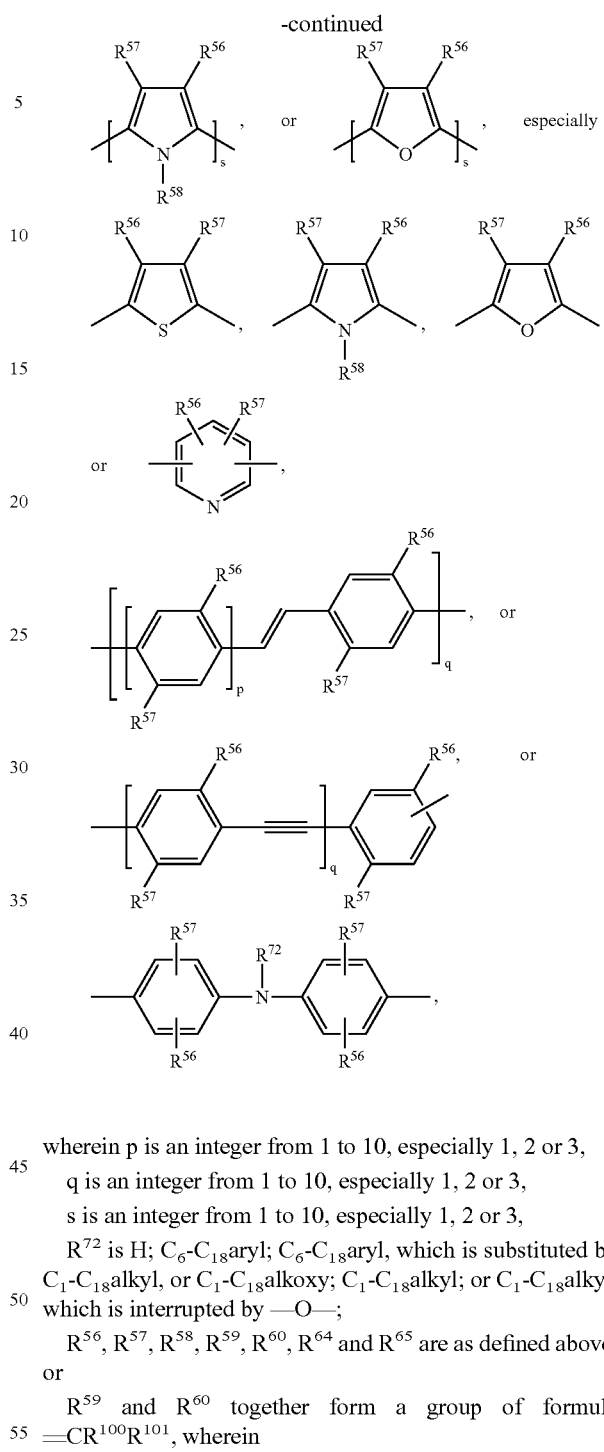

wherein p is an integer from 1 to 10, especially 1, 2 or 3,
q is an integer from 1 to 10, especially 1, 2 or 3,
s is an integer from 1 to 10, especially 1, 2 or 3,
$R^{72}$ is H; $C_6$-$C_{18}$aryl; $C_6$-$C_{18}$aryl, which is substituted by $C_1$-$C_{18}$alkyl, or $C_1$-$C_{18}$alkoxy; $C_1$-$C_{18}$alkyl; or $C_1$-$C_{18}$alkyl, which is interrupted by —O—;
$R^{56}$, $R^{57}$, $R^{58}$, $R^{59}$, $R^{60}$, $R^{64}$ and $R^{65}$ are as defined above, or
$R^{59}$ and $R^{60}$ together form a group of formula =$CR^{100}R^{101}$, wherein
$R^{100}$ and $R^{101}$ are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, or $C_2$-$C_{20}$heteroaryl, or $C_2$-$C_{20}$heteroaryl which is substituted by E, wherein D and E are defined as above.

Preferably, $R^{56}$ and $R^{57}$ are independently of each other H, $C_1$-$C_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, and n-heptyl, $C_1$-$C_{18}$alkyl, which is substituted by E and/or interrupted by D, such as —CH$_2$OCH$_3$, —CH$_2$OCH$_2$CH$_3$, —CH$_2$OCH$_2$CH$_2$OCH$_3$, and —CH$_2$OCH$_2$CH$_2$OCH$_2$CH$_3$, C$_5$-C$_{12}$cycloalkyl, such as cyclohexyl, C$_6$-C$_{24}$aryl, such as phenyl, naphthyl, and biphenyl, or C$_6$-C$_{24}$aryl, which is substituted by E, such as —C$_6$H$_4$OCH$_3$, —C$_6$H$_4$OCH$_2$CH$_3$, —C$_6$H$_3$(OCH$_3$)$_2$, —C$_6$H$_3$(OCH$_2$CH$_3$)$_2$, —C$_6$H$_4$CH$_3$, —C$_6$H$_3$(CH$_3$)$_2$, —C$_6$H$_2$(CH$_3$)$_3$, and —C$_6$H$_4$tBu.

R$^{58}$ is preferably H, C$_1$-C$_{18}$alkyl, such as methyl, ethyl, n-propyl, iso-propyl, n-butyl, isobutyl, sec-butyl, t-butyl, 2-methylbutyl, n-pentyl, isopentyl, n-hexyl, 2-ethylhexyl, and n-heptyl, or C$_6$-C$_{24}$aryl, such as phenyl, naphthyl, and biphenyl.

If R$^{59}$ and R$^{60}$ together form a group of formula =CR$^{100}$R$^{101}$, T is preferably a group of formula

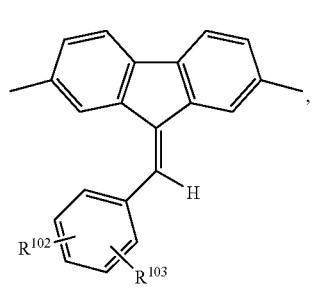

wherein R$^{102}$ and R$^{103}$ are independently of each other C$_1$-C$_{18}$alkyl, C$_1$-C$_{18}$alkoxy, C$_6$-C$_{10}$aryl, C$_6$-C$_{10}$aryloxy, or di(C$_1$-C$_{18}$alkyl)amino, wherein the aryl or aryloxy groups optionally can be substituted by C$_1$-C$_8$alkyl (cf. U.S. Pat. No. 6,512,083).

Preferably, R$^{59}$ and R$^{60}$ are independently of each other H, C$_1$-C$_{18}$alkyl, such as n-butyl, sec-butyl, hexyl, octyl, and 2-ethyl-hexyl, C$_1$-C$_{18}$alkyl which is substituted by E and/or interrupted by D, such as —CH$_2$(OCH$_2$CH$_2$)$_w$OCH$_3$, w=1, 2, 3, or 4, C$_6$-C$_{24}$aryl, such as naphthyl, and biphenyl, C$_6$-C$_{24}$ aryl which is substituted by E, such as —C$_6$H$_4$OCH$_3$, —C$_6$H$_4$OCH$_2$CH$_3$, —C$_6$H$_3$(OCH$_3$)$_2$, —C$_6$H$_3$(OCH$_2$CH$_3$)$_2$, —C$_6$H$_4$CH$_3$, —C$_6$H$_3$(CH$_3$)$_2$, —C$_6$H$_2$(CH$_3$)$_3$, and —C$_6$H$_4$tBu, or R$^{59}$ and R$^{60}$ together form a 4 to 8 membered ring, preferably a 5 or 6 membered ring, such as cyclohexyl, and cyclopentyl.

Preferably, R$^{64}$ and R$^{65}$ are independently of each other H, C$_1$-C$_{18}$alkyl, such as methyl, ethyl, n-propyl, iso-propyl, n-butyl, isobutyl, and sec-butyl, or C$_6$-C$_{24}$aryl, such as phenyl, naphthyl, and biphenyl.

A preferred embodiment is directed to polymers comprising a repeating unit of formula IIb, especially a repeating unit of formula IIa, or IIc, and a co-monomer

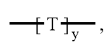

wherein x is in the range of 0.005 to 1, especially 0.4 to 0.6, and y is in the range of 0.995 to 0, especially 0.6 to 0.4, wherein the sum of x and y is 1, wherein X$^3$ is a group of the formula

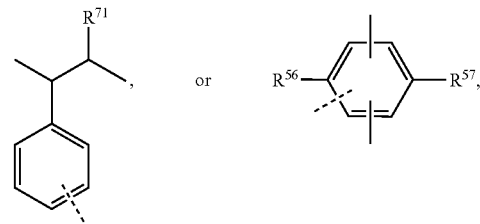

wherein the dotted line represent the bond to the pyrimidine ring,

R$^3$, R$^4$ and R$^5$ are independently of each other a group of the formula

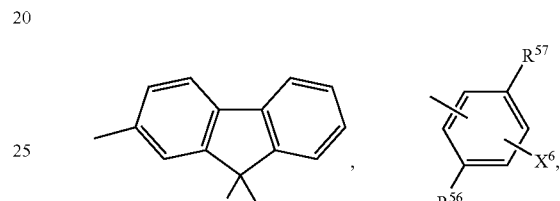

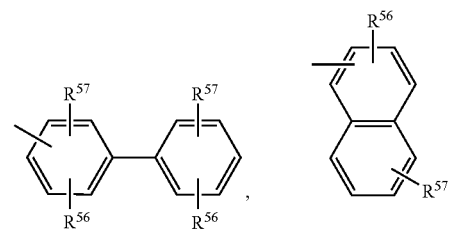

T is a group of formula

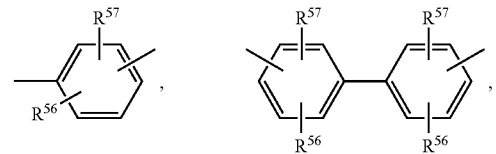

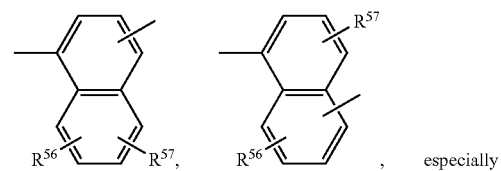

, especially

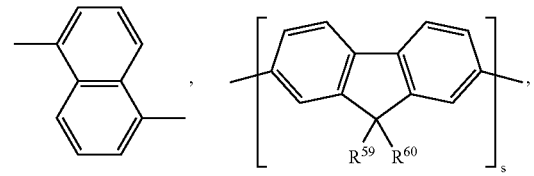

-continued

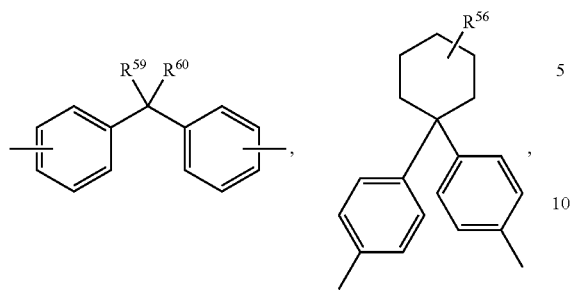

especially

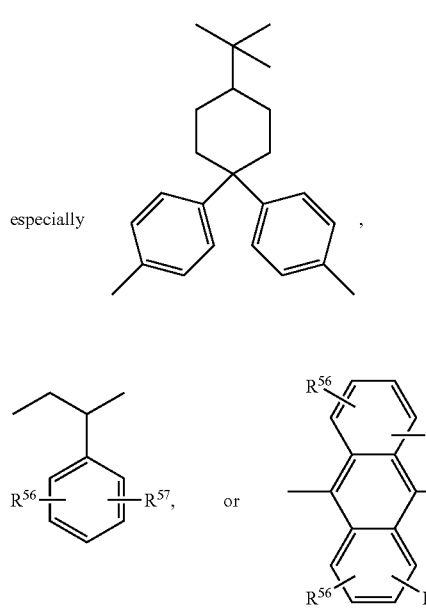

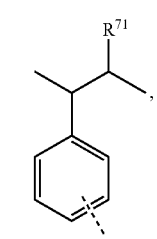

wherein s is 1, or 2, $R^{56}$, $R^{57}$ and $X^6$ are independently of each other $C_1$-$C_{18}$alkyl, $C_1$-$C_{18}$alkyl, which is substituted by E and/or interrupted by D, $C_6$-$C_{24}$aryl, $C_6$-$C_{24}$aryl, which is substituted by E, $R^{59}$ and $R^{60}$ are independently of each other $C_1$-$C_{18}$alkyl, $C_1$-$C_{18}$alkyl, which is substituted by —$OR^{29}$ and/or interrupted by —O—, $R^{71}$ is H, —$CONR^{25}R^{25}$ or —CN, wherein D is —O—, or —$NR^{25}$—, E is —$OR^{29}$, —$SR^{29}$, or —$NR^{25}R^{25}$, wherein $R^{25}$ is H, $C_1$-$C_{18}$alkyl, or $C_6$-$C_{24}$ aryl, and $R^{29}$ is $C_1$-$C_{18}$alkyl, $C_6$-$C_{24}$ aryl.

A particularly preferred embodiment is directed to polymers, comprising a repeating unit of formula IIb, especially a repeating unit of formula IIa, or IIc, and a co-monomer —$\{T\}_y$—, wherein x is in the range of 0.005 to 1, especially 0.4 to 0.6, and y is in the range of 0.995 to 0, especially 0.6 to 0.4, wherein the sum of x and y is 1, $X^3$ is a group of the formula

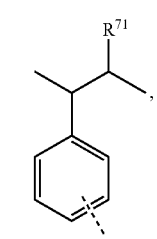

wherein the dotted line represent the bond to the pyrimidine ring and $R^{71}$ is H, alkyl, —C≡N, or —$COOR^{27}$, wherein $R^{27}$ is H, or $C_1$-$C_{18}$alkyl, which optionally can be interrupted by one or more oxygen atoms, especially $C_4$-$C_{12}$alkyl, which can be interrupted by one or two oxygen atoms, $R^3$, $R^4$ and $R^5$ are independently of each other H,

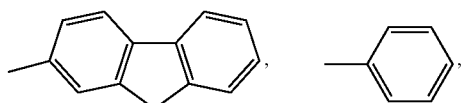

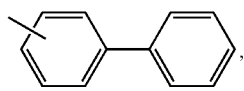

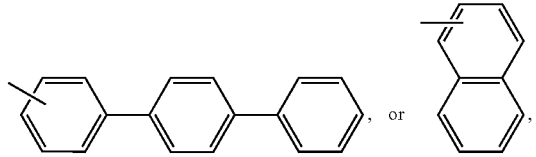

T is a group of formula

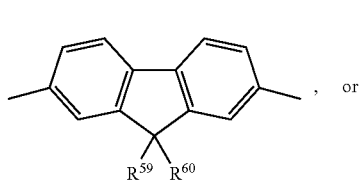

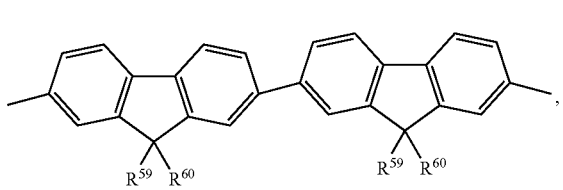

wherein $R^{59}$ and $R^{60}$ are independently of each other $C_1$-$C_{18}$alkyl, especially $C_4$-$C_{12}$alkyl, which can be interrupted by one or two oxygen atoms,

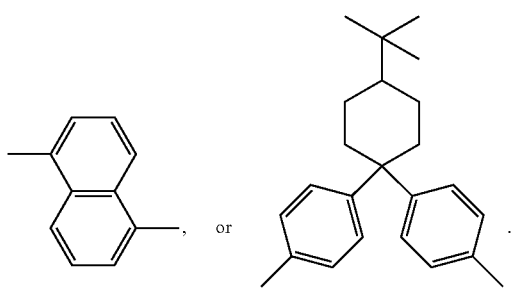

are preferred; and polymers comprising repeating units of formula

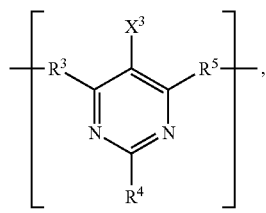 (IIb)

wherein $R^3$, $R^4$, and $R^5$ are independently of each other

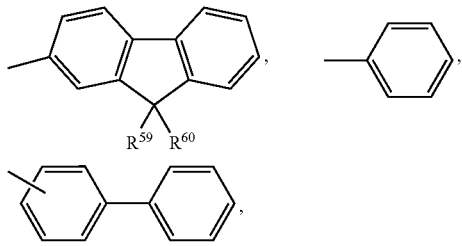

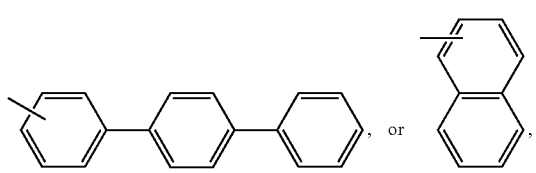, or and polymers comprising repeating units of formula

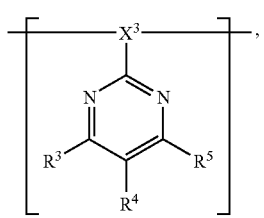 (IIa)

wherein $R^4$ is H and $R^3$ and $R^5$ are independently of each other

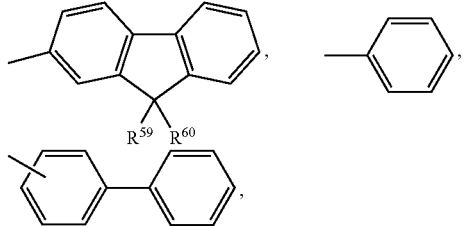

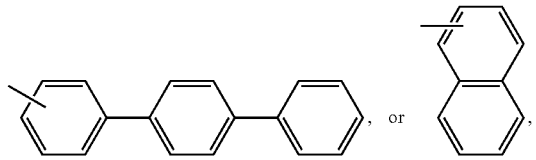, or and polymers comprising repeating units of formula

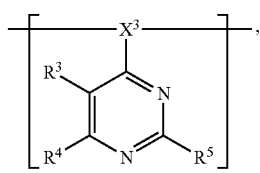 (IIc)

wherein $R^3$ is H and $R^4$ and $R^5$ are independently of each other

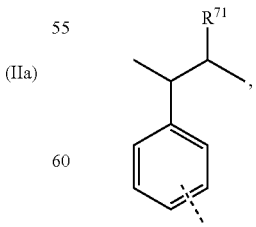

wherein $X^3$ is a group of the formula wherein the dotted line represent the bond to the pyrimidine ring and $R^{71}$ is H, alkyl, —C≡N, or —COOR$^{27}$, wherein $R^{27}$ is H; or $C_1$-$C_{18}$alkyl; which optionally can be interrupted by one or more oxygen atoms, especially $C_4$-$C_{12}$alkyl, which can be interrupted by one or two oxygen atoms, and T is a group of formula

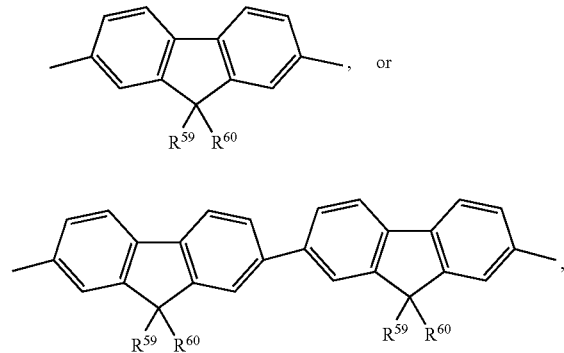, or wherein $R^{59}$ and $R^{60}$ are independently of each other $C_1$-$C_{18}$alkyl, especially $C_4$-$C_{12}$alkyl, which can be interrupted by one or two oxygen atoms,

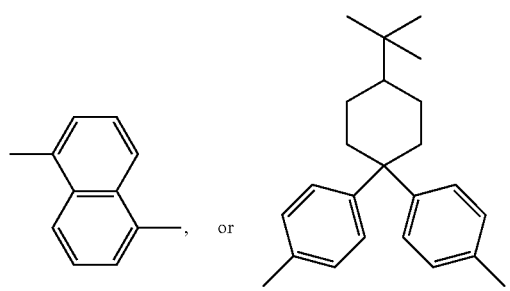, or are especially preferred.

The term "polymers" comprises according to the present invention oligomers having a weight average molecular weight of <3,000 Daltons and polymers having a weight average molecular weight of 3,000 Daltons or greater.

The polymers of this invention preferably have a weight average molecular weight of 50,000 Daltons or greater, more preferably 100,000 Daltons or greater, and most preferably 150,000 Daltons or greater; preferably 1,000,000 Daltons or less, more preferably 500,000 Daltons or less and most preferably 250,000 Daltons or less. Molecular weights are determined according to gel permeation chromatography using polystyrene standards.

A further embodiment of the present invention is represented by the monomers of the formula

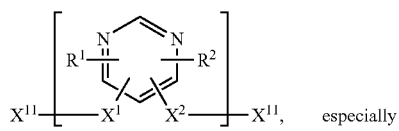, especially (III)

-continued

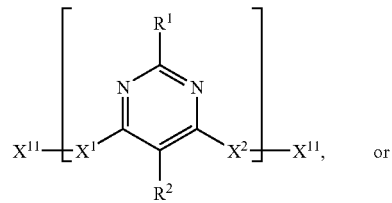 or (IIIa)

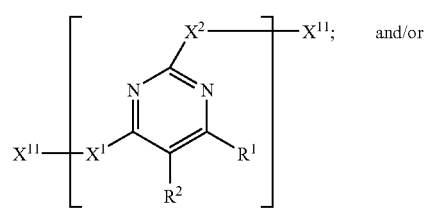; and/or (IIIb)

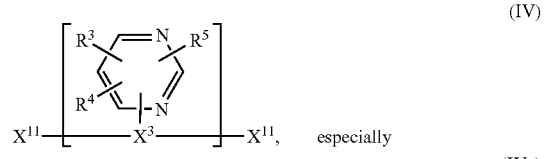 (IV)

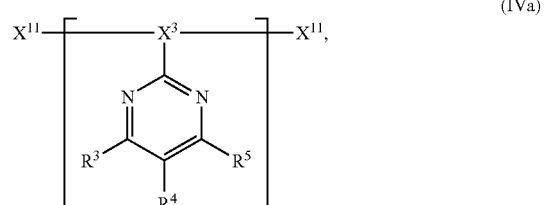, especially (IVa)

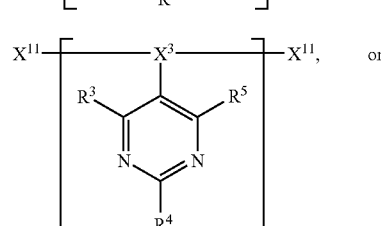, or (IVb)

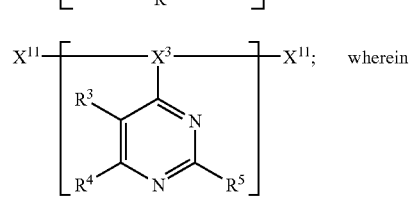; wherein (IVc)

$R^1$, $R^2$, $R^3$, $R^4$ and $R^5$ are independently of each other an organic substituent, especially $C_2$-$C_{30}$aryl or a $C_2$-$C_{26}$heteroaryl, which optionally can be substituted, $X^1$, $X^2$, and $X^3$ are independently of each other a divalent linking group, and $X^{11}$ is independently in each occurrence a halogen atom, or —B(OH)$_2$, —B(OY$^1$)$_2$ or

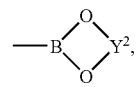

wherein $Y^1$ is independently in each occurrence a $C_1$-$C_{10}$alkyl group and $Y^2$ is independently in each occurrence a $C_2$-$C_{10}$alkylene group, such as —CY$^3$Y$^4$—CY$^5$Y$^6$—, or —CY⁷Y⁸—CY⁹Y¹⁰—CY¹¹Y¹²—, wherein $Y^3, Y^4, Y^5, Y^6, Y^7, Y^8, Y^9, Y^{10}, Y^{11}$ and $Y^{12}$ are independently of each other hydrogen, or a $C_1$-$C_{10}$alkyl group, especially —C(CH$_3$)$_2$C(CH$_3$)$_2$—, or —C(CH$_3$)$_2$CH$_2$C(CH$_3$)$_2$—, which are starting materials in the preparation of the polymers of formula I and II, with the proviso that 2-phenyl-4,6-bis(p-bromophenyl)pyrimidine (A. L. Vais et al., Izv. Sib. Otd. Akad. Nauk. SSSR, vol. 6. 1975, 144-146) and 2,4,6-tris(p-bromophenyl)pyrimidine (M. Bajic et al., Molecules, vol. 6, no. 5, 2001, 477-480) are excluded.

The pyrimidine starting compounds are known or can be prepared according to or analogous to known procedures. The present pyrimidine compounds are for instance derivatives of known hydroxyphenyl pyrimidine compounds: U.S. Pat. No. 3,442,898, U.S. Pat. No. 5,597,854 and U.S. Pat. No. 5,753,729, the relevant parts of which are hereby incorporated by reference. The present pyrimidine compounds can for instance be prepared according to or analogous to the following procedure:

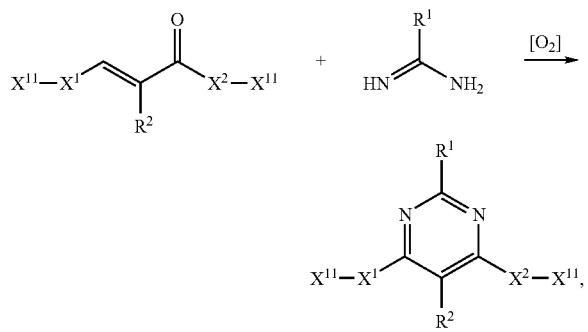

wherein $R^1, R^2, X^1$ and $X^2$ are as defined above and $X^{11}$ is a halogen atom.

An amidine hydrochloride is added to a 2-propen-1-one derivative in a $C_1$-$C_4$-alcohol, like methanol, ethanol, propanol or butanol. A base, for example, an alkali metal hydroxide or alkoxide, such as sodium methoxide or potassium hydroxide is added and the solution is stirred in the presence of oxygen, for example dry air (see, for example European patent application no. 03405047.6; example 8).

The boron-containing compounds of formula (IV) may be prepared by any suitable method. An example of reaction conditions for preparing boron-containing compounds is described in Remmers et al., Macromolecular Rapid Communications, Vol. 17, 239-253 (1996).

Compounds of formulas (IV), which are disubstituted by chlorine or bromine, are converted to the corresponding dilithio derivative by reaction with two equivalents of butyllithium. Reaction of the dilithio derivative with a trialkylborate followed by hydrolysis yields the diboronic acid derivative. Esterification of the diboronic acid derivative with an alkylenediol, such as ethylene glycol, gives the di(cyclic) boronate derivative.

Halogen is fluorine, chlorine, bromine and iodine.

$C_1$-$C_{18}$alkyl is a branched or unbranched radical such as for example methyl, ethyl, propyl, isopropyl, n-butyl, sec-butyl, isobutyl, tert-butyl, 2-ethylbutyl, n-pentyl, isopentyl, 1-methylpentyl, 1,3-dimethylbutyl, n-hexyl, 1-methylhexyl, n-heptyl, isoheptyl, 1,1,3,3-tetramethylbutyl, 1-methylheptyl, 3-methylheptyl, n-octyl, 2-ethylhexyl, 1,1,3-trimethylhexyl, 1,1,3,3-tetramethylpentyl, nonyl, decyl, undecyl, 1-methylundecyl, dodecyl, 1,1,3,3,5,5-hexamethylhexyl, tridecyl, tetradecyl, pentadecyl, hexadecyl, heptadecyl, or octadecyl.

$C_1$-$C_{18}$alkoxy radicals are straight-chain or branched alkoxy radicals, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy.

$C_2$-$C_{18}$alkenyl radicals are straight-chain or branched alkenyl radicals, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-24}$alkynyl is straight-chain or branched and preferably $C_{2-8}$alkynyl, which may be unsubstituted or substituted, such as, for example, ethynyl, 1-propyn-3-yl, 1-butyn-4-yl, 1-pentyn-5-yl, 2-methyl-3butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_4$-$C_{18}$cycloalkyl is preferably $C_5$-$C_{12}$cycloalkyl, such as, for example, cyclopentyl, cyclohexyl, cycloheptyl, cyclooctyl, cyclononyl, cyclodecyl, cyclododecyl. Cyclohexyl and cyclopentyl are most preferred.

$C_2$-$C_{18}$alkenyl is for example vinyl, allyl, butenyl, pentenyl, hexenyl, heptenyl, or octenyl.

Aryl is usually $C_6$-$C_{30}$aryl, preferably $C_6$-$C_{24}$aryl, which optionally can be substituted, such as, for example, phenyl, 4-methylphenyl, 4-methoxyphenyl, naphthyl, biphenylyl, 2-fluorenyl, phenanthryl, anthryl, tetracyl, pentacyl, hexacyl, terphenylyl or quadphenylyl.

$C_7$-$C_{24}$aralkyl radicals are preferably $C_7$-$C_{15}$aralkyl radicals, which may be substituted, such as, for example, benzyl, 2-benzyl-2-propyl, β-phenethyl, α,α-dimethylbenzyl, ω-phenyl-butyl, ω-phenyl-octyl, ω-phenyl-dodecyl or 3-methyl-5-(1',1',3',3'-tetramethyl-butyl)-benzyl.

$C_2$-$C_{26}$heteroaryl is a ring with five to seven ring atoms or a condensed rig system, wherein nitrogen, oxygen or sulfur are the possible hetero atoms, and is typically an unsaturated heterocyclic radical with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, perimidinyl, phenanthrolinyl, phenazinyl, isothiazolyl, phenothiazinyl, isoxazolyl, furazanyl or phenoxazinyl, which can be unsubstituted or substituted.

Examples of a five or six membered ring formed by $R^6$ and $R^7$ and $R^{56}$ and $R^{57}$, respectively are heterocycloalkanes or heterocycloalkenes having from 3 to 5 carbon atoms which can have one additional hetero atom selected from nitrogen, oxygen and sulfur, for example

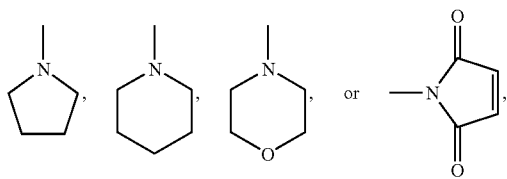

which can be part of a bicyclic system, for example

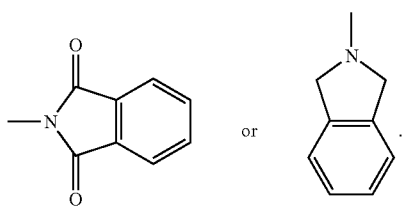

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group or a silyl group.

The term "haloalkyl" means groups given by partially or wholly substituting the above-mentioned alkyl group with halogen, such as trifluoromethyl etc. The "aldehyde group, ketone group, ester group, carbamoyl group and amino group" include those substituted by an alkyl group, a cycloalkyl group, an aryl group, an aralkyl group or a heterocyclic group, wherein the alkyl group, the cycloalkyl group, the aryl group, the aralkyl group and the heterocyclic group may be unsubstituted or substituted. The term "silyl group" means a group of formula —$SiR^{105}R^{106}R^{107}$, wherein $R^{105}$, $R^{106}$ and $R^{107}$ are independently of each other a $C_1$-$C_8$alkyl group, in particular a $C_1$-$C_4$ alkyl group, a $C_6$-$C_{24}$aryl group or a $C_7$-$C_{12}$aralkyl group, such as a trimethylsilyl group.

If a substituent, such as, for example $R^6$, $R^7$, $R^{56}$ and $R^{57}$, occurs more than one time in a formula, it can be different in each occurrence.

As described above, the aforementioned radicals may be substituted by E and/or, if desired, interrupted by D. Interruptions are of course possible only in the case of radicals containing at least 2 carbon atoms connected to one another by single bonds; $C_6$-$C_{18}$aryl is not interrupted; interrupted arylalkyl or alkylaryl contains the unit D in the alkyl moiety. $C_1$-$C_{18}$alkyl substituted by one or more E and/or interrupted by one or more units D is, for example, $(CH_2CH_2O)_n$—$R^x$, where n is a number from the range 1-9 and $R^x$ is H or $C_1$-$C_{10}$alkyl or $C_2$-$C_{10}$alkanoyl (e.g. CO—$CH(C_2H_5)C_4H_9$), $CH_2$—$CH(OR^{y'})$—$CH_2$—O—$R^y$, where $R^y$ is $C_1$-$C_{18}$alkyl, $C_5$-$C_{12}$cycloalkyl, phenyl, $C_7$-$C_{15}$phenylalkyl, and $R^{y'}$ embraces the same definitions as $R^y$ or is H;

$C_1$-$C_8$alkylene-COO—$R^z$, e.g. $CH_2COOR^z$, $CH(CH_3)COOR^z$, $C(CH_3)_2COOR^z$, where $R^z$ is H, $C_1$-$C_{18}$alkyl, $(CH_2CH_2O)_{1-9}$—$R^x$, and $R^x$ embraces the definitions indicated above;

$CH_2CH_2$—O—CO—CH=$CH_2$; $CH_2CH(OH)CH_2$—O—CO—$C(CH_3)$=$CH_2$.

The polymers containing groups of formulas (I) and (II) may be prepared by any suitable process, but are preferably prepared by the processes described below. The condensation reaction of an aromatic boronate and a bromide, commonly referred to as the "Suzuki reaction", is tolerant of the presence of a variety of organic functional groups and as reported by N. Miyaua and A. Suzuki in Chemical Reviews, Vol. 95, pp. 457-2483 (1995). This reaction can be applied to preparing high molecular weight polymers and copolymers.

To prepare polymers corresponding to formula I or II, a dibromide corresponding to formula III, or IV, or a mixture thereof is reacted with an equimolar amount of diboronic acid or diboronate corresponding to formula III, or IV, or a mixture thereof, preferably co-monomer

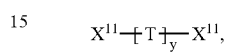

wherein $X^{11}$ is independently in each occurrence a halogen atom, or —$B(OH)_2$, —$B(OY^1)_2$ or

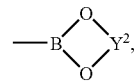

wherein $Y^1$ is independently in each occurrence a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, or —$C(CH_3)_2CH_2C(CH_3)_2$—, under the catalytic action of Pd and triphenylphosphine. The reaction is typically conducted at about 70° C. to 120° C. in an aromatic hydrocarbon solvent such as toluene. Other solvents such as dimethylformamide and tetrahydrofuran can also be used alone, or in mixtures with an aromatic hydrocarbon. An aqueous base, preferably sodium carbonate or bicarbonate, is used as the HBr scavenger. Depending on the reactivities of the reactants, a polymerization reaction may take 2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed., 2003, 42, 1407 and references cited therein). Other variations of reaction conditions are given by T. I. Wallow and B. M. Novak in Journal of Organic Chemistry, Vol. 59, pp. 5034-5037 (1994); and M. Remmers, M. Schulze, and G. Wegner in Macromolecular Rapid Communications, Vol. 17, pp. 239-252 (1996).

An alternating copolymer results when a dibromide corresponding to formula (III) or (IV) is reacted with a diboronate corresponding to formula

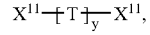

wherein $X^{11}$ is independently in each occurrence —$B(OH)_2$, —$B(OY^1)_2$ or

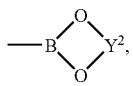

wherein $Y^1$ is independently in each occurrence a $C_1$-$C_{10}$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, or —$C(CH_3)_2CH_2C(CH_3)_2$—. If desired, a monofunctional aryl halide or aryl boronate may be used as a chain-terminator in such reactions, which will result in the formation of a terminal aryl group.

Polymerization processes involving only dihalo-functional reactants may be carried out using nickel coupling reactions. One such coupling reaction was described by Colon et al. in Journal of Polymer Science, Part A, Polymer Chemistry Edition, Vol. 28, p. 367 (1990), and by Colon et al. in Journal of Organic Chemistry, Vol. 51, p. 2627 (1986). The reaction is typically conducted in a polar aprotic solvent (e.g., dimethylacetamide) with a catalytic amount of nickel salt, a substantial amount of triphenylphosphine and a large excess of zinc dust. A variant of this process is described by Ioyda et al. in Bulletin of the Chemical Society of Japan, Vol. 63, p. 80 (1990) wherein an organo-soluble iodide was used as an accelerator. Another nickel-coupling reaction was disclosed by Yamamoto in Progress in Polymer Science, Vol. 17, p. 1153 (1992) wherein a mixture of dihaloaromatic compounds were treated with an excess amount of nickel (1,5-cyclooctadiene) complex in an inert solvent. All nickel-coupling reactions when applied to reactant mixtures of two or more aromatic dihalides yield essentially random copolymers. Such polymerization reactions may be terminated by the addition of small amounts of water to the polymerization reaction mixture, which will replace the terminal halogen groups with hydrogen groups. Alternatively, a monofunctional aryl halide may be used as a chain-terminator in such reactions, which will result in the formation of a terminal aryl group.

In one embodiment, the polymers of the invention contain conjugated groups other than the pyrimidine groups described above. "Conjugated groups" refer to moieties containing double bonds, triple bonds and/or aromatic rings. Examples of such groups are the above mentioned co-monomers T. The incorporation of such groups into the polymer may be used to modify the light absorption, ionization potential, and/or electronic properties of the polymer. Such polymers may be prepared using the methods described above incorporating at least one conjugated compound different from the pyrimidine compounds described above. Such conjugated compounds, hereinafter referred to as "comonomers", have functional groups which permit them to copolymerize with the pyrimidine compounds. For example, dihalofunctional comonomers are preferably used in conjunction with dihalo-functional pyrimidine compounds in nickel-coupling polymerization reactions; dihalo-functional comonomers are preferably used in conjunction with pyrimidine-diboronic acids or pyrimidine-diboronates; and conjugated comonomers bearing diboronic acid or diboronate functionalities are preferably used in conjunction with dihalopyrimidines. For the purpose of preparing polymers of the invention, more than one diboronic acid/diboronate and more than one dibromide may be used in a Suzuki polymerization reaction so long as the total molar amount of diboronic acids/diboronates is essentially equivalent to the total amount of dibromides.

Nickel-coupling polymerizations yield essentially random copolymers comprising pyrimidine group-containing units and units derived from other co-monomers, while Suzuki polymerizations yield alternating copolymers.

It is possible to control the sequencing of the monomeric units in the resulting copolymer by controlling the order and composition of monomer feeds in the Suzuki reaction. For instance, a high molecular weight copolymer comprising mainly large blocks of pyrimidine homopolymers connected to short blocks of alternating pyrimidine co-monomer oligomers may be made by first introducing into the reaction reactants in the appropriate ratio to make the alternating pyrimidine-comonomer oligomers followed by the remainder of pyrimidine monomers so long as there is an overall balance of boronic and bromo groups.

Usually the polymers of the present invention comprise end moieties $E^1$, wherein $E^1$ is hydrogen or an aryl moiety which may optionally be substituted with a reactive group capable of undergoing chain extension or crosslinking, or a tri($C_1$-$C_{18}$)alkylsiloxy group. As used herein, a reactive group capable of undergoing chain extension or crosslinking refers to any group which is capable of reacting with another of the same group or another group so as to form a link to prepare oligomers or polymers. Preferably, such reactive group is a hydroxy, glycidyl ether, acrylate ester, methacrylate ester, ethenyl, ethynyl, maleimide, nadimide, trifluorovinyl ether moiety or a cyclobutene moiety fused to the aromatic ring of $E^1$.

The polymers of the present invention, where $E^1$ are reactive groups as defined above, are capable of crosslinking to form solvent resistant, heat-resistant films at 100° C. or more, more preferably at 150° C. or more. Preferably, such crosslinking occurs at 350° C. or less, more preferably 300° C. or less and most preferably 250° C. or less. The crosslinkable polymers of the invention are stable at 100° C. or more and more preferably 150° C. or more. "Stable" as used herein means that such polymers do not undergo crosslinking or polymerization reactions at or below the stated temperatures. If a crosslinkable material is desired, $E^1$ is preferably a vinylphenyl, an ethynylphenyl, or 4-(or 3-)benzocyclobutenyl radical. In another embodiment, E is selected from a group of phenolic derivatives of the formula —$C_6H_4$—O—Y, wherein Y is

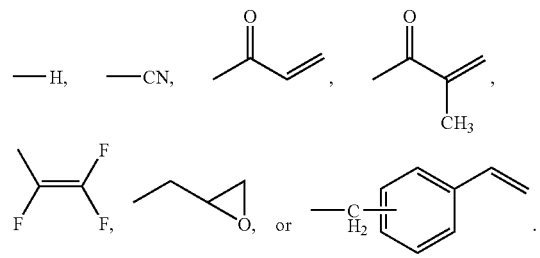

if desired, the cross-linkable groups can be present in other parts of the polymer chain. For example, one of the substituents of the co-monomer T may be a crosslinkable group $E^1$.

The end-capping agent $E^1$—X ($E^1$ is as defined above and X is either Cl or Br) is incorporated into the polymers of the present invention under the condition in which the resulting polymers are substantially capped by the reactive group $E^1$.

The reactions useful for this purpose are the nickel-coupling and Suzuki reactions described above. The average degree of polymerization is controlled by the mole ratio of monomers to end-capping agent.

Depending on the process of preparation the polymers of the present invention can be homopolymers, block copolymers, random copolymers, or alternating copolymers.

Another aspect of this invention is related to polymer blends containing 1 to 99 percent of at least one pyrimidine containing polymers of this invention. The remainder 1 percent to 99 percent of the blend is composed of one or more polymeric materials selected from among chain growth polymers such as polystyrene, polybutadiene, poly(methyl methacrylate), and poly(ethylene oxide); step-growth polymers such as phenoxy resins, polycarbonates, polyamides, polyesters, polyurethanes, and polyimides; and crosslinked polymers such as crosslinked epoxy resins, crosslinked phenolic resins, crosslinked acrylate resins, and crosslinked urethane resins. Examples of these polymers may be found in Preparative Methods of Polymer Chemistry, W. R. Sorenson and T. W. Campbell, Second Edition, Interscience Publishers (1968). Also may be used in the blends are conjugated polymers such as poly(phenylene vinylene), substituted poly(phenylene vinylene)s, substituted polyphenylenes and polythiophenes. Examples of these conjugated polymers are given by Greenham and Friend in Solid State Physics, Vol. 49, pp. 1-149 (1995).

Another aspect of the invention is the films formed from the polymers of the invention. Such films can be used in polymeric light-emitting diodes. Preferably, such films are used as emitting layers. These polymers may also be used as protective coatings for electronic devices and as fluorescent coatings. The thickness of the coating or film is dependent upon the ultimate use. Generally, such thickness can be from 0.01 to 200 microns. In that embodiment wherein the coating is used as a fluorescent coating, the coating or film thickness is from 50 to 200 microns. In that embodiment where the coatings are used as electronic protective layers, the thickness of the coating can be from 5 to 20 microns. In that embodiment where the coatings are used in a polymeric light-emitting diode, the thickness of the layer formed is 0.05 to 2 microns. The polymers of the invention form good pinhole- and defect-free films. Such films can be prepared by means well known in the art including spin-coating, spray-coating, dip-coating and roller-coating. Such coatings are prepared by a process comprising applying a composition to a substrate and exposing the applied composition to conditions such that a film is formed. The conditions which form a film depend upon the application technique and the reactive end groups of the aryl moiety. In a preferred embodiment, the composition applied to the substrate comprises the pyrimidine polymers dissolved in a common organic solvent. Preferably, the solution contains from 0.1 to 10 weight percent of the polymers. This composition is applied to the appropriate substrate by the desired method and the solvent is allowed to evaporate. Residual solvent may be removed by vacuum and/or by heat. After removal of the solvent, the coating is then exposed to the necessary conditions to cure the film, if needed, to prepare a film having high solvent and heat resistance. The films are preferably substantially uniform in thickness and substantially free of pinholes. In another embodiment, the polymers may be partially cured. This is known as B-staging.

A further embodiment of the present invention is directed to an optical device or a component therefore, comprising a substrate and a polymer according to the present invention.

A device according to the present invention may be prepared in accordance with the disclosure of WO99/48160, the contents of which are incorporated by reference. Polymers according to the present invention may be present in the device as the sole light emitting polymer or as a component in a blend further comprising hole and/or electron transporting polymers. Alternatively, the device may comprise distinct layers of a polymer of the present invention, a hole transporting polymer and/or an electron transporting polymer.

In one embodiment the optical device comprises an electroluminescent device, which comprises (a) a charge injecting layer for injecting positive charge carriers, (b) a charge injecting layer for injecting negative charge carriers, (c) a light-emissive layer located between the layers (a) and (b) comprising a polymer according to the present invention.

The layer (a) may be a positive charge carrier transport layer which is located between the light emissive layer (c) and an anode electrode layer, or may be an anode electrode layer. The layer (b) may be a negative charge carrier transport layer which is located between the light emissive layer (c) and an cathode electrode layer, or may be an cathode electrode layer. Optionally, an organic charge transport layer can be located between the light emissive layer (c) and one of the charge carrier injecting layers (a) and (b).

The EL device emits light below 520 nm, especially between 380 nm and 520 nm.

The EL device has a NTSC coordinate of between about (0.12, 0.05) and about (0.16, 0.10), especially a NTSC coordinate of about (0.14, 0.08).

It will be appreciated that the light emissive layer may be formed from a blend or mixture of materials including one or more polymers according to the present invention, and optionally further different polymers. The further different polymers may be so-called hole transport polymers (i.e. to improve the efficiency of hole transport to the light-emissive material) or electron-transport polymers (i.e. to improve the efficiency of electron transport to the light-emissive material). Preferably, the blend or mixture would comprise at least 0.1% by weight of a polymer according to the present invention, preferably from 0.2 to 50%, more preferably from 0.5 to 30% by weight.

An organic EL device typically consists of an organic film sandwiched between an anode and a cathode such that when a positive bias is applied to the device, holes are injected into the organic film from the anode, and electrons are injected into the organic film from the cathode. The combination of a hole and an electron may give rise to an exciton, which may undergo radiative decay to the ground state by liberating a photon. In practice the anode is commonly an mixed oxide of tin and indium for its conductivity and transparency. The mixed oxide (ITO) is deposited on a transparent substrate such as glass or plastic so that the light emitted by the organic film may be observed. The organic film may be the composite of several individual layers each designed for a distinct function. Since holes are injected from the anode, the layer next to the anode needs to have the functionality of transporting holes. Similarly, the layer next to the cathode needs to have the functionality of transporting electrons. In many instances, the hole-(electron) transporting layer also acts as the emitting layer. In some instances one layer can perform the combined functions of hole and electron transport and light emission. The individual layers of the organic film may be all polymeric in nature or combinations of films of polymers and films of small molecules deposited by thermal evaporation. It is preferred that the total thickness of the organic film be less than 1000 nanometers (nm). It is more preferred that the total thickness be less than 500 nm. It is most preferred that the total thickness be less than 300 nm. It is preferred that the thickness of the active (light emitting) layer be less than 400 nanometers (nm). It is more preferred that the thickness is in the range of from 40 to 160 nm.

The ITO-glass which serves as the substrate and the anode may be used for coating after the usual cleaning with detergent, organic solvents and UV-ozone treatment. It may also be first coated with a thin layer of a conducting substance to facilitate hole injection. Such substances include copper phthalocyanine, polyaniline and poly(3,4-ethylenedioxythiophene) (PEDT); the last two in their conductive forms by doping with a strong organic acid, e.g., poly(styrenesulfonic acid). It is preferred that the thickness of this layer be 200 nm or less; it is more preferred that the thickness be 100 nm or less.

In the cases where a hole-transporting layer is used, the polymeric arylamines described in U.S. Pat. No. 5,728,801, may be used. Other known hole-conducting polymers, such as polyvinylcarbazole, may also be used. The resistance of this layer to erosion by the solution of the copolymer film which is to be applied next is obviously critical to the successful fabrication of multi-layer devices. The thickness of this layer may be 500 nm or less, preferably 300 nm or less, most preferably 150 nm or less.

In the case where an electron-transporting layer is used, it may be applied either by thermal evaporation of low molecular weight materials or by solution coating of a polymer with a solvent that would not cause significant damage to the underlying film.

Examples of low molecular weight materials include the metal complexes of 8-hydroxyquinoline (as described by Burrows et al. in Applied Physics Letters, Vol. 64, pp. 2718-2720 (1994)), metallic complexes of 10-hydroxybenzo(h)quinoline (as described by Hamada et al. in Chemistry Letters, pp. 906-906 (1993)), 1,3,4-oxadiazoles (as described by Hamada et al. in Optoelectronics—Devices and Technologies, Vol. 7, pp. 83-93 (1992)), 1,3,4-triazoles (as described by Kido et al. in Chemistry Letters, pp. 47-48 (1996)), and dicarboximides of perylene (as described by Yoshida et al. in Applied Physics Letters, Vol. 69, pp. 734736 (1996)).

Polymeric electron-transporting materials are exemplified by 1,3,4-oxadiazole-containing polymers (as described by Li et al. in Journal of Chemical Society, pp. 2211-2212 (1995), by Yang and Pei in Journal of Applied Physics, Vol 77, pp. 4807-4809 (1995)), 1,3,4-triazole-containing polymers (as described by Strukelj et al. in Science, Vol. 267, pp. 1969-1972 (1995)), quinoxaline-containing polymers (as described by Yamamoto et al. in Japan Journal of Applied Physics, Vol. 33, pp. L250-L253 (1994), O'Brien et al. in Synthetic Metals, Vol. 76, pp. 105-108 (1996)), and cyano-PPV (as described by Weaver et al. in Thin Solid Films, Vol. 273, pp. 39-47 (1996)). The thickness of this layer may be 500 nm or less, preferably 300 nm or less, most preferably 150 nm or less.

The metallic cathode may be deposited either by thermal evaporation or by sputtering. The thickness of the cathode may be from 100 nm to 10,000 nm. The preferred metals are calcium, magnesium, indium, and aluminum. Alloys of these metals may also be used. Alloys of aluminum containing 1 to 5 percent of lithium and alloys of magnesium containing at least 80 percent of magnesium are preferred.

In a preferred embodiment, the electroluminescent device comprises at least one hole-transporting polymer film and a light-emitting polymer film comprised of the polymer of the invention, arranged between an anode material and a cathode material such that under an applied voltage, holes are injected from the anode material into the hole-transporting polymer film and electrons are injected from the cathode material into the light-emitting polymer films when the device is forward biased, resulting in light emission from the light-emitting layer.

In another preferred embodiment, layers of hole-transporting polymers are arranged so that the layer closest to the anode has the lower oxidation potential, with the adjacent layers having progressively higher oxidation potentials. By these methods, electroluminescent devices having relatively high light output per unit voltage may be prepared.

The term "hole-transporting polymer film" as used herein refers to a layer of a film of a polymer which when disposed between two electrodes to which a field is applied and holes are injected from the anode, permits adequate transport of holes into the emitting polymer. Hole-transporting polymers typically are comprised of triarylamine moieties. The term "light-emitting polymer film" as used herein refers to a layer of a film of a polymer whose excited states can relax to the ground state by emitting photons, preferably corresponding to wavelengths in the visible range. The term "anode material" as used herein refers to a semi-transparent, or transparent, conducting film with a work function between 4.5 electron volts (eV) and 5.5 eV. Examples are gold, silver, copper, aluminum, indium, iron, zinc, tin, chromium, titanium, vanadium, cobalt, nickel, lead, manganese, tungsten and the like, metallic alloys such as magnesium/copper, magnesium/silver, magnesium/aluminum, aluminum/indium and the like, semiconductors such as Si, Ge, GaAs and the like, metallic oxides such as indium-tin-oxide ("ITO"), ZnO and the like, metallic compounds such as CuI and the like, and furthermore, electroconducting polymers such polyacetylene, polyaniline, polythiophene, polypyrrole, polyparaphenylene and the like. Oxides and mixed oxides of indium and tin, and gold are preferred. Most preferred is ITO, especially ITO on glass as substrate. The term "cathode material" as used herein refers to a conducting film with a work function between 2.5 eV and 4.5 eV. Examples are alkali metals, earth alkaline metals, group 13 elements, silver, and copper as well as alloys or mixtures thereof such as sodium, lithium, potassium, calcium, lithium fluoride (LiF), sodium-potassium alloy, magnesium, magnesium-silver alloy, magnesium-copper alloy, magnesium-aluminum alloy, magnesium-indium alloy, aluminum, aluminum-aluminum oxide alloy, aluminum-lithium alloy, indium, calcium, and materials exemplified in EP-A 499,011, such as electroconducting polymers e.g. polypyrrole, polythiophene, polyaniline, polyacetylene etc. Preferably lithium, calcium, magnesium, indium, silver, aluminum, or blends and alloys of the above are used. In the case of using a metal or a metallic alloy as a material for an electrode, the electrode can be formed also by the vacuum deposition method. In the case of using a metal or a metallic alloy as a material forming an electrode, the electrode can be formed, furthermore, by the chemical plating method (see for example, Handbook of Electrochemistry, pp. 383-387, Mazuren, 1985). In the case of using an electroconducting polymer, an electrode can be made by forming it into a film by means of anodic oxidation polymerization method onto a substrate, which is previously provided with an electroconducting coating.

As methods for forming said thin films, there are, for example, the vacuum deposition method, the spin-coating method, the casting method, the Langmuir-Blodgett ("LB") method, the ink jet printing method and the like. Among these methods, the vacuum deposition method, the spin-coating method, the ink jet printing method and the casting method are particularly preferred in view of ease of operation and cost.

In the case of forming the layers by using the spin-coating method, the casting method and ink jet printing method, the coating can be carried out using a solution prepared by dissolving the composition in a concentration of from 0.0001 to 90% by weight in an appropriate organic solvent such as benzene, toluene, xylene, tetrahydrofurane, methyltetrahydrofurane, N,N-dimethylformamide, dichloromethane, dimethylsulfoxide and the like.

The organic EL device of the present invention has significant industrial values since it can be adapted for a flat panel display of an on-wall television set, a flat light-emitting device, a light source for a copying machine or a printer, a light source for a liquid crystal display or counter, a display signboard and a signal light. The polymers and compositions of the present invention can be used in the fields of an organic EL device, a photovoltaic device, an electrophotographic photoreceptor, a photoelectric converter, a solar cell, an image sensor, and the like.

The following examples are included for illustrative purposes only and do not limit the scope of the claims. Unless otherwise stated, all parts and percentages are by weight.

EXAMPLE 1

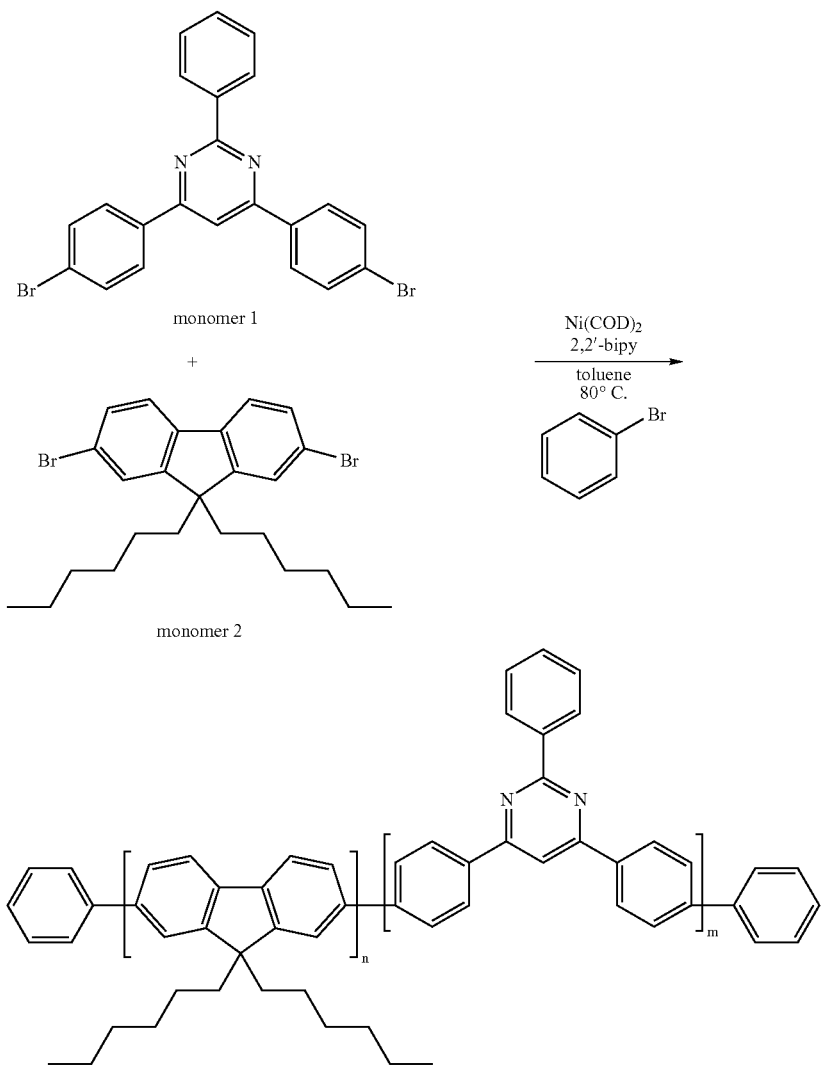

Bis(1,5-cyclooctadiene)nickel(0) (2.0 g, 7.27 mmol) and 2,2'-bipyridyl (1.14 g, 7.27 mmol) are dissolved in anhydrous toluene (7.0 ml) and stirred at 80° C. for 1 hour under an argon atmosphere in the dark. Monomer 1 (0.85 g, 1.82 mmol) and 2,7-dibromo-9,9-dihexylfluorene (0.89 g, 1.82 mmol) are dissolved in anhydrous toluene (7.0 ml) and purged thoroughly with argon, then added to the solution of Ni complex and stirred at 80° C. for 17 hours under argon in the dark. Anhydrous toluene (7.0 ml) is added and the reaction allowed to progress a further 5 hours. Bromobenzene (1 ml, 9.5 mmol) is added and the reaction stirred for a further 2 hours. The reaction mixture is poured into stirred methanol/c.HCl$_{(aq)}$ (10:1, 600 ml) and the resulting precipitate is stirred for 30 minutes and collected by filtration. The precipitate was redissolved in toluene (80 ml) and the precipitation repeated in acidic methanol. The precipitate is redissolved in chloroform (80 ml) and passed through a plug of silica, then washed through with chloroform (5×100 mL). The combined chloroform phases are concentrated to ca. 80 ml and precipitated in stirred methanol (600 ml) and stirred for 30 minutes. The polymer is collected by filtration and dried. 0.674 g; 58% recovery of material; $M_w$=650,000, $P_D$=2.21.

The polymerisation of Example 1 may be used to produce either high $M_w$ homopolymers or high $M_w$ statistical co-polymers from the following monomer families:

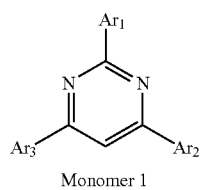 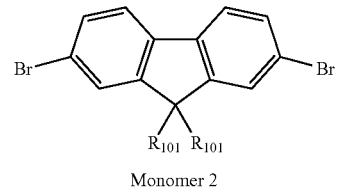

Monomer 1  Monomer 2

| Polymer | Ar$_1$ | Ar$_2$ | Ar$_3$ | R$_{101}$ |
|---|---|---|---|---|
| 1 | phenyl | 4-bromophenyl | 4-bromophenyl | n-hexyl |
| 2 | phenyl | 4-bromophenyl | 4'bromobiphenyl | n-hexyl |
| 3 | phenyl | 4'bromobiphenyl | 4'bromobiphenyl | n-hexyl |
| 4 | phenyl | 4-bromophenyl | 4-bromophenyl | n-heptyl |
| 5 | phenyt | 4-bromophenyl | 4'bromobiphenyl | n-heptyl |
| 6 | phenyl | 4'bromobiphenyl | 4'bromobiphenyl | n-heptyl |
| 7 | phenyl | 4-bromophenyl | 4-bromophenyl | n-octyl |
| 8 | phenyl | 4-bromophenyl | 4'bromobiphenyl | n-octyl |
| 9 | phenyl | 4'bromobiphenyl | 4'bromobiphenyl | n-octyl |
| 10 | 4-$^t$butylphenyl | 4-bromophenyl | 4-bromophenyl | n-hexyl |
| 11 | 4-$^t$butylphenyl | 4-bromophenyl | 4'bromobiphenyl | n-hexyl |
| 12 | 4-$^t$butylphenyl | 4'bromobiphenyl | 4'bromobiphenyl | n-hexyl |
| 13 | 4-$^t$butylphenyl | 4-bromophenyl | 4-bromophenyl | n-heptyl |
| 14 | 4-$^t$butylphenyl | 4-bromophenyl | 4-bromobtphenyl | n-heptyl |
| 15 | 4-$^t$butylphenyl | 4'bromobiphenyl | 4'bromobiphenyl | n-heptyl |
| 16 | 4-$^t$butylphenyl | 4-bromophenyl | 4-bromophenyl | n-octyl |
| 17 | 4-$^t$butylphenyl | 4-bromophenyl | 4'bromobiphenyl | n-octyl |
| 18 | 4-$^t$butylphenyl | 4'bromobiphenyl | 4'bromobiphenyl | n-octyl |
| 19 | 4-hexylphenyl | 4-bromophenyl | 4-bromophenyl | n-hexyl |
| 20 | 4-hexylphenyl | 4-bromophenyl | 4'bromobiphenyl | n-hexyl |
| 21 | 4-hexylphenyl | 4'bromobiphenyl | 4'bromobiphenyl | n-hexyl |
| 22 | 4-hexylphenyl | 4-bromophenyl | 4-bromophenyl | n-heptyl |
| 23 | 4-hexylphenyl | 4-bromophenyl | 4'bromobiphenyl | n-heptyl |
| 24 | 4-hexytphenyl | 4'bromobiphenyl | 4'bromobiphenyl | n-heptyl |
| 25 | 4-hexylphenyl | 4-bromophenyl | 4-bromophenyl | n-octyl |
| 26 | 4-hexylphenyl | 4-bromophenyl | 4'bromobiphenyl | n-octyl |
| 27 | 4-hexytphenyl | 4'bromobiphenyl | 4'bromobiphenyl | n-octyl |

-continued

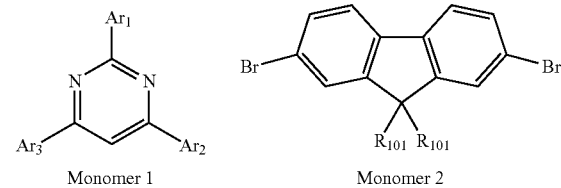

Monomer 1  Monomer 2

| Polymer | Ar$_1$ | Ar$_2$ | Ar$_3$ | R$_{101}$ |
|---|---|---|---|---|
| 28 | 4-$^t$butylbiphenyl | 4-bromophenyl | 4-bromophenyl | n-hexyl |
| 29 | 4-$^t$butylbiphenyl | 4-bromophenyl | 4'bromobiphenyl | n-hexyl |
| 30 | 4-$^t$butylbiphenyl | 4'bromobiphenyl | 4'bromobiphenyl | n-hexyl |
| 31 | 4-$^t$butylbiphenyl | 4-bromophenyl | 4-bromophenyl | n-heptyl |
| 32 | 4-$^t$butylbiphenyl | 4-bromophenyl | 4'bromobiphenyl | n-heptyl |
| 33 | 4-$^t$butylbiphenyl | 4'bromobiphenyl | 4'bromobiphenyl | n-heptyl |
| 34 | 4-$^t$butylbiphenyl | 4-bromophenyl | 4-bromophenyl | n-octyl |
| 35 | 4-$^t$butylbiphenyl | 4-bromophenyl | 4'bromobiphenyl | n-octyl |
| 36 | 4-$^t$butylbiphenyl | 4'bromobiphenyl | 4'bromobiphenyl | n-octyl |
| 37 | biphenyl | 4-bromophenyl | 4-bromophenyl | n-hexyl |
| 38 | biphenyl | 4-bromophenyl | 4'bromobiphenyl | n-hexyl |
| 39 | biphenyl | 4'bromobiphenyl | 4'bromobiphenyl | n-hexyl |
| 40 | biphenyl | 4-bromophenyl | 4-bromophenyl | n-heptyl |
| 41 | biphenyl | 4-bromophenyl | 4'bromobiphenyl | n-heptyl |
| 42 | biphenyl | 4'bromobiphenyl | 4'bromobiphenyl | n-heptyl |
| 43 | biphenyl | 4-bromophenyl | 4-bromophenyl | n-octyl |
| 44 | biphenyl | 4-bromophenyl | 4'bromobiphenyl | n-octyl |
| 45 | biphenyl | 4'bromobiphenyl | 4'bromobiphenyl | n-octyl |
| 46 | 2-naphthyl | 4-bromophenyl | 4-bromophenyl | n-hexyl |
| 47 | 2-naphthyl | 4-bromophenyl | 4'bromobiphenyl | n-hexyl |
| 48 | 2-naphthyl | 4'bromobiphenyl | 4'bromobiphenyl | n-hexyl |
| 49 | 2-naphthyl | 4-bromophenyl | 4-bromophenyl | n-heptyl |
| 50 | 2-naphthyl | 4-bromophenyl | 4'bromobiphenyl | n-heptyl |
| 51 | 2-naphthyl | 4'bromobiphenyl | 4'bromobiphenyl | n-heptyl |
| 52 | 2-naphthyl | 4-bromophenyl | 4-bromophenyl | n-octyl |
| 53 | 2-naphthyl | 4-bromophenyl | 4'bromobiphenyl | n-octyl |
| 54 | 2-naphthyl | 4'bromobiphenyl | 4'bromobiphenyl | n-octyl |
| 55 | 3,4-dibutoxy-phenyl | 4-bromophenyl | 4-bromophenyl | —[1] |
| 56 | 3,4-dioktoxy-phenyl | 4-bromophenyl | 4-bromophenyl | —[1] |
| 57 | 3,4-didecan-oxyphenyl | 4-bromophenyl | 4-bromophenyl | —[1] |

[1] Homopolymer; no momomer 2.

EXAMPLE 2

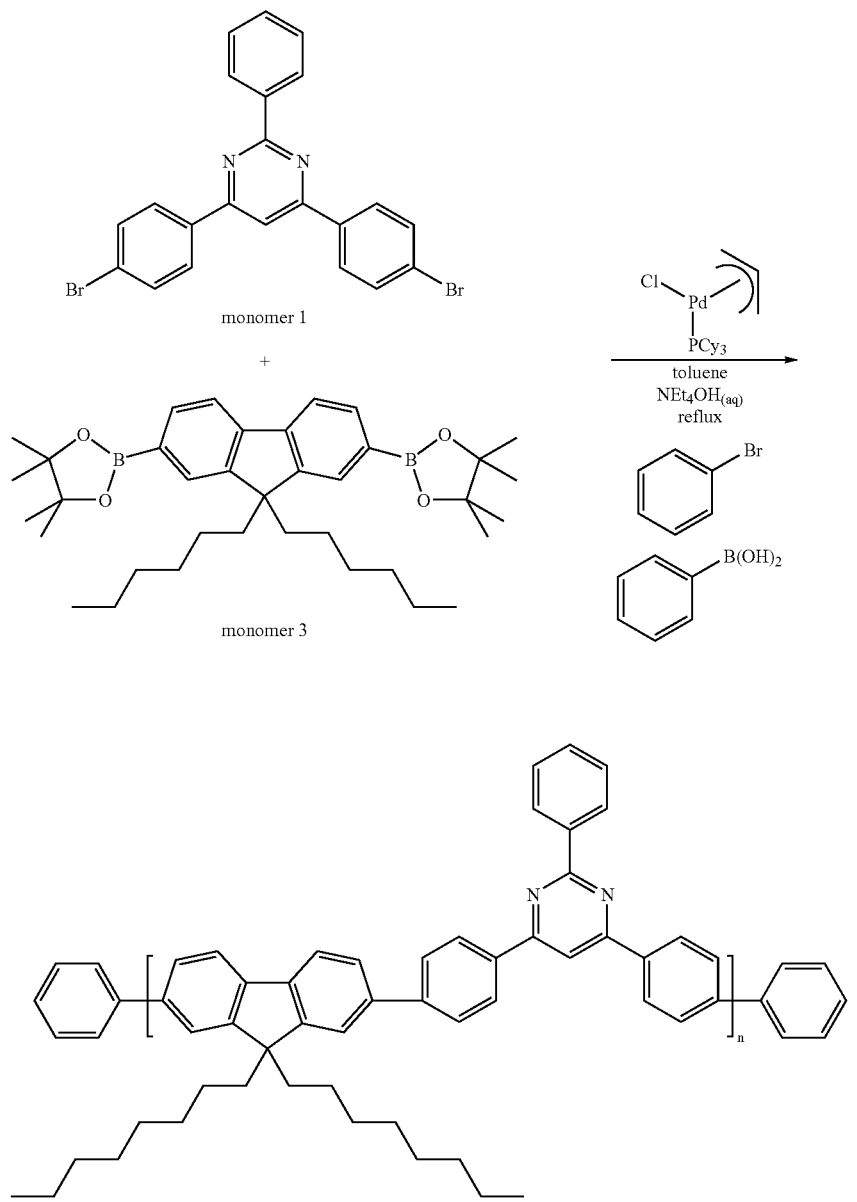

Monomer 1 (1.0 g, 2.15 mmol) and monomer 3 (1.38 g, 2.15 mmol) are suspended in toluene (15 ml) and purged by bubbling argon through for 10 minutes. Palladium catalyst (1 mol %) is added and the toluene phase purged for a further 10 minutes. Tetraethylammonium hydroxide (20% aq. solution; 8 ml) is added and the whole heated to reflux for 20 hours. Bromobenzene (0.2 ml) is added and the reaction allowed to proceed for a further hour, then phenylboronic acid added and the reaction stirred for another hour. On cooling the reaction mixture is diluted with toluene (20 ml) and poured into acidic methanol (10 ml 32% $HCl_{(aq)}$ in 500 ml MeOH) and filtered. The pale solid is redissolved in $CHCl_3$ (100 ml) and filtered through a plug of silica (3 cm), then washed through with $CHCl_3$ (500 ml). The $CHCl_3$ is removed and the residue redissolved in toluene (100 ml) and stirred vigorously with an aqueous solution of disodium EDTA (5%, 200 ml) for 1 hour. The toluene phase is separated, concentrated to ca. 50 ml and precipitated in MeOH (400 ml), filtered and dried. 875 mg, 79% recovery.

The polymerisation of Example 2 may be used to produce alternating copolymers of the following monomer families:

Monomer 1: pyrimidine with Ar1 at 2-position, Ar2 and Ar3 at 4,6-positions.

Monomer 3: 9,9-di($R_{101}$)-fluorene-2,7-diboronic acid bis(pinacol ester)

| Polymer | Ar$_1$ | Ar$_2$ | Ar$_3$ | R$_{101}$ |
|---|---|---|---|---|
| 58 | phenyl | 4-bromophenyl | 4-bromophenyl | n-hexyl |
| 59 | phenyl | 4-bromophenyl | 4'bromobiphenyl | n-hexyl |
| 60 | phenyl | 4'bromobiphenyl | 4'bromobiphenyl | n-hexyl |
| 61 | phenyl | 4-bromophenyl | 4-bromophenyl | n-heptyl |
| 62 | phenyl | 4-bromophenyl | 4'bromobiphenyl | n-heptyl |
| 63 | phenyl | 4'bromobiphenyl | 4'bromobiphenyl | n-heptyl |
| 64 | phenyl | 4-bromophenyl | 4-bromophenyl | n-octyl |
| 65 | phenyl | 4-bromophenyl | 4'bromobiphenyl | n-octyl |
| 66 | phenyl | 4'bromobiphenyl | 4'bromobiphenyl | n-octyl |
| 67 | 4-$^t$butylphenyl | 4-bromophenyl | 4-bromophenyl | n-hexyl |
| 68 | 4-$^t$butylphenyl | 4-bromophenyl | 4'bromobiphenyl | n-hexyl |
| 69 | 4-$^t$butylphenyl | 4'bromobiphenyl | 4'bromobiphenyl | n-hexyl |
| 70 | 4-$^t$butylphenyl | 4-bromophenyl | 4-bromophenyl | n-heptyl |
| 71 | 4-$^t$butylphenyl | 4-bromophenyl | 4'bromobiphenyl | n-heptyl |
| 72 | 4-$^t$butylphenyl | 4'bromobiphenyl | 4'bromobiphenyl | n-heptyl |
| 73 | 4-$^t$butylphenyl | 4-bromophenyl | 4-bromophenyl | n-octyl |
| 74 | 4-$^t$butylphenyl | 4-bromophenyl | 4'bromobiphenyl | n-octyl |
| 75 | 4-$^t$butylphenyl | 4'bromobiphenyl | 4'bromobiphenyl | n-octyl |
| 76 | 4-hexylphenyl | 4-bromophenyl | 4-bromophenyl | n-hexyl |
| 77 | 4-hexylphenyl | 4-bromophenyl | 4'bromobiphenyl | n-hexyl |
| 78 | 4-hexylphenyl | 4'bromobiphenyl | 4'bromobiphenyl | n-hexyl |
| 79 | 4-hexylphenyl | 4-bromophenyl | 4-bromophenyl | n-heptyl |
| 80 | 4-hexyphenyl | 4-bromophenyl | 4'bromobiphenyl | n-heptyl |
| 81 | 4-hexylphenyl | 4'bromobiphenyl | 4'bromobiphenyl | n-heptyl |
| 82 | 4-hexylphenyl | 4-bromophenyl | 4-bromophenyl | n-octyl |
| 83 | 4-hexylphenyl | 4-bromophenyl | 4'bromobiphenyl | n-octyl |
| 84 | 4-hexylphenyl | 4'bromobiphenyl | 4'bromobiphenyl | n-octyl |
| 85 | 4-$^t$butylbiphenyl | 4-bromophenyl | 4-bromophenyl | n-hexyl |
| 86 | 4-$^t$butylbiphenyl | 4-bromophenyl | 4'bromobiphenyl | n-hexyl |
| 87 | 4-$^t$butylbiphenyl | 4'bromobiphenyl | 4'bromobiphenyl | n-hexyl |
| 88 | 4-$^t$butylbiphenyl | 4-bromophenyl | 4-bromophenyl | n-heptyl |
| 89 | 4-$^t$butylbiphenyl | 4-bromophenyl | 4'bromobiphenyl | n-heptyl |
| 90 | 4-$^t$butylbiphenyl | 4'bromobiphenyl | 4'bromobiphenyl | n-heptyl |
| 91 | 4-$^t$butylbiphenyl | 4-bromophenyl | 4-bromophenyl | n-octyl |
| 92 | 4-$^t$butylbiphenyl | 4-bromophenyl | 4'bromobiphenyl | n-octyl |
| 93 | 4-$^t$butylbiphenyl | 4'bromobiphenyl | 4'bromobiphenyl | n-octyl |
| 94 | biphenyl | 4-bromophenyl | 4-bromophenyl | n-hexyl |
| 95 | biphenyl | 4-bromophenyl | 4'bromobiphenyl | n-hexyl |
| 96 | biphenyl | 4'bromobiphenyl | 4'bromobiphenyl | n-hexyl |
| 97 | biphenyl | 4-bromophenyl | 4-bromophenyl | n-heptyl |
| 98 | biphenyl | 4-bromophenyl | 4'bromobiphenyl | n-heptyl |
| 99 | biphenyl | 4'bromobiphenyl | 4'bromobiphenyl | n-heptyl |
| 100 | biphenyl | 4-bromophenyl | 4-bromophenyl | n-octyl |
| 101 | biphenyl | 4-bromophenyl | 4'bromobiphenyl | n-octyl |
| 102 | biphenyl | 4'bromobiphenyl | 4'bromobiphenyl | n-octyl |
| 103 | 2-naphthyl | 4-bromophenyl | 4-bromophenyl | n-hexyl |
| 104 | 2-naphthyl | 4-bromophenyl | 4'bromobiphenyl | n-hexyl |
| 105 | 2-naphthyl | 4'bromobiphenyl | 4'bromobiphenyl | n-hexyl |
| 106 | 2-naphthyl | 4-bromophenyl | 4-bromophenyl | n-heptyl |
| 107 | 2-naphthyl | 4-bromophenyl | 4'bromobiphenyl | n-heptyl |
| 108 | 2-naphthyl | 4'bromobiphenyl | 4'bromobiphenyl | n-heptyl |
| 109 | 2-naphthyl | 4-bromophenyl | 4-bromophenyl | n-octyt |
| 110 | 2-naphthyl | 4-bromophenyl | 4'bromobiphenyl | n-octyl |
| 111 | 2-naphthyl | 4'bromobiphenyl | 4'bromobiphenyl | n-octyl |

EXAMPLE 3

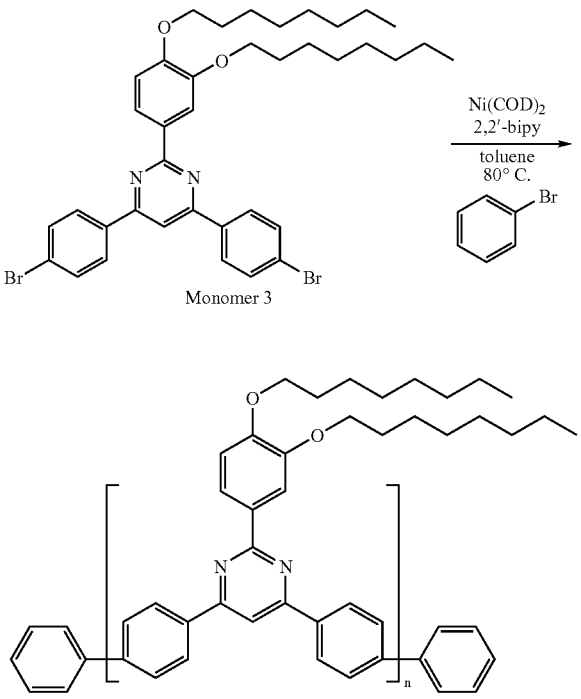

Bis(1,5-cyclooctadiene)nickel(0) (2.0 g, 7.27 mmol) and 2,2'-bipyridyl (1.14 g, 7.27 mmol) are dissolved in anhydrous toluene (7.0 ml) and stirred at 80° C. for 1 hour under an argon atmosphere in the dark. Monomer 3 (2.38 g, 3.3 mmol) is dissolved in anhydrous toluene (7.0 ml) and purged thoroughly with argon, then added to the solution of Ni complex and stirred at 80° C. for 17 hours, under argon in the dark. Anhydrous toluene (7.0 ml) is added and the reaction allowed to progress a further 5 hours. Bromobenzene (1 ml, 9.5 mmol) is added and the reaction stirred for a further 2 hours. The reaction mixture is poured into stirred methano/c.HCl$_{(aq)}$ (10:1, 600 ml) and the resulting precipitate is stirred for 30 minutes and collected by filtration. The precipitate is redissolved in toluene (80 ml) and the precipitation in acidic methanol repeated. The precipitate is redissolved in chloroform (80 ml) and passed through a plug of silica then washed through with chloroform (5×100 ml). The combined chloroform phases were concentrated to ca. 80 ml and precipitated in stirred methanol (600 ml) and stirred for 30 minutes. The polymer is collected by filtration and dried.

EXAMPLE 4

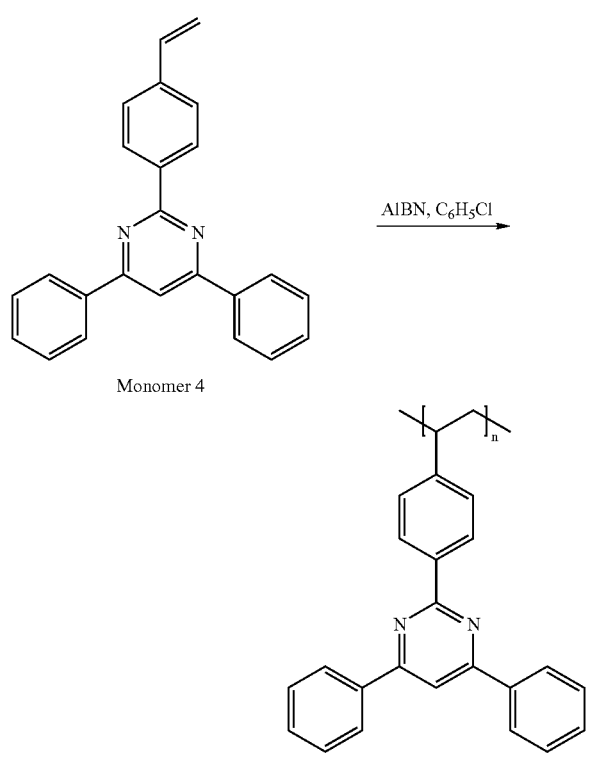

Monomer 4 (5.0 g, 14.95 mmol), AIBN (48 mg, 0.293 mmol) and chlorobenzene (12 g) are purged with argon, then heated to 150° C. under an argon atmosphere for 2 hours The hot solution was poured into stirred methanol (300 ml) and the resultant white precipitate filtered. The precipitate is redissolved in toluene (60 ml) and slowly dropped into an acidic methanol solution (2 ml c.HCl$_{(aq)}$ in 400 ml MeOH). The polymer is filtered, washed with methanol and dried at 40° C. in vacuo overnight. Mass=3.5 g, 70% recovery of materials; $M_w$=20,000 (GPC, PS standards).

EXAMPLE 5

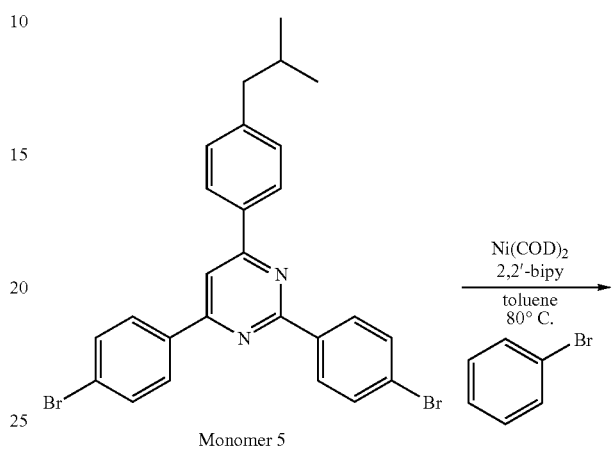

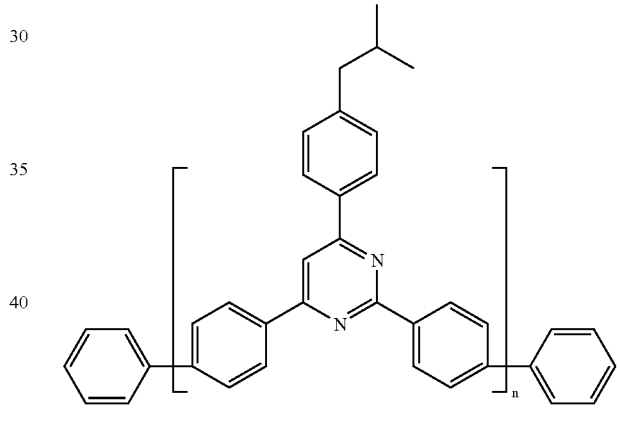

Bis(1,5-cyclooctadiene)nickel(0) (2.0 g, 7.27 mmol) and 2,2'-bipyridyl (1.14 g, 7.27 mmol) are dissolved in anhydrous toluene (7.0 ml) and stirred at 80° C. for 1 hour under an argon atmosphere in the dark. Monomer 5 (2.38 g, 3.3 mmol) is dissolved in anhydrous toluene (7.0 mL) and purged thoroughly with argon, then added to the solution of Ni complex and stirred at 80° C. for 17 hours, under argon in the dark. Anhydrous toluene (7.0 ml) is added and the reaction allowed to progress a further 5 hours. Bromobenzene (1 ml, 9.5 mmol) is added and the reaction stirred for a further 2 hours. The reaction mixture is poured into stirred methano/c.HCl$_{(aq)}$ (10:1, 600 ml) and the resulting precipitate is stirred for 30 minutes and collected by filtration. The precipitate is redissolved in toluene (80 ml) and the precipitation in acidic methanol repeated. The precipitate is redissolved in chloroform (80 ml) and passed through a plug of silica, then washed through with chloroform (5×100 ml). The combined chloroform phases were concentrated to ca. 80 ml and precipitated in stirred methanol (600 ml) and stirred for 30 minutes. The polymer is collected by filtration and dried.

EXAMPLE 6

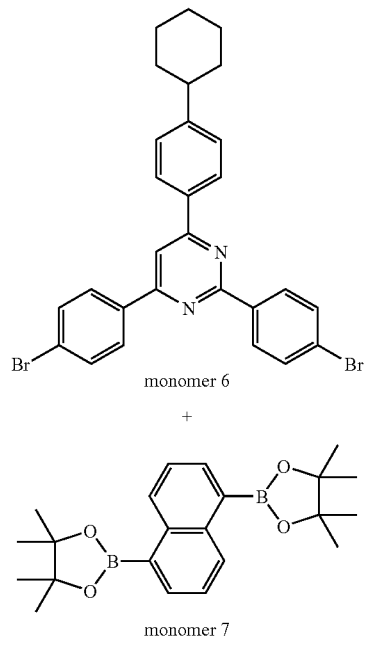

Monomer 6 (2.0 g, 3.65 mmol) and monomer 7 (1.38 g, 3.65 mmol) are suspended in toluene (15 ml) and purged by bubbling argon through for 10 minutes. Palladium catalyst (1 mol %) is added and the toluene phase purged for a further 10 minutes. Tetraethylammonium hydroxide (20% aq. solution; 14 ml) is added and the whole heated to reflux for 20 hours. Bromobenzene (0.2 ml) is added and the reaction allowed to proceed for a further hour, then phenylboronic acid is added and the reaction stirred for another hour. On cooling the reaction mixture is diluted with toluene (20 ml) and poured into acidic methanol (10 ml 32% $HCl_{(aq)}$ in 500 ml MeOH) and filtered. The pale solid is redissolved in toluene (100 ml) and stirred vigorously with an aqueous solution of disodium EDTA (5%, 200 ml) for 1 hour. The toluene phase is separated, concentrated to ca. 50 ml and precipitated in MeOH (400 ml), filtered and dried.

EXAMPLE 7

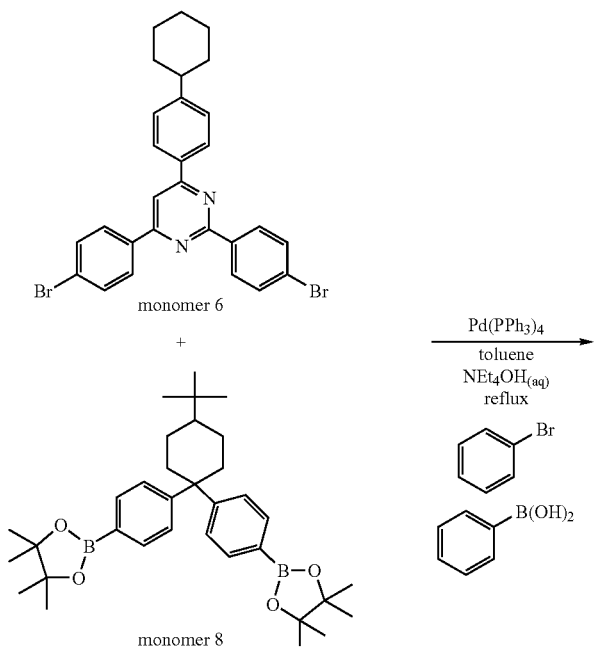

-continued

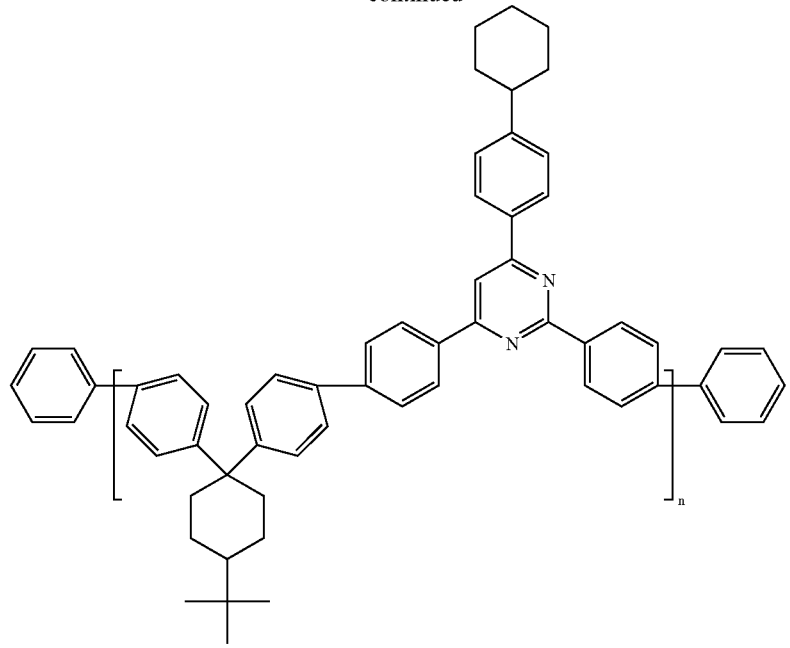

Monomer 6 (2.0 g, 3.65 mmol) and monomer 7 (1.98 g, 3.65 mmol) are suspended in toluene (15 ml) and purged by bubbling argon through for 10 minutes. Palladium catalyst (1 mol %) is added and the toluene phase purged for a further 10 minutes. Tetraethylammonium hydroxide (20% aq. solution; 14 ml) is added and the whole heated to reflux for 20 hours. Bromobenzene (0.2 ml) is added and the reaction allowed to proceed for a further hour, then phenylboronic acid is added and the reaction stirred for another hour. On cooling the reaction mixture was diluted with toluene (20 ml) and poured into acidic methanol (10 ml 32% $HCl_{(aq)}$ in 500 ml MeOH) and filtered. The pale solid is redissolved in toluene (100 ml) and stirred vigorously with an aqueous solution of disodium EDTA (5%, 200 mL) for 1 hour. The toluene phase is separated, concentrated to ca. 50 ml and precipitated in MeOH (400 ml), filtered and dried.

APPLICATION EXAMPLE 1

The ITO-glass used for device fabrication has a nominal sheet resistance of 12 ohm/square. The hole injection conducting polymer when used is poly(3,4-ethylenedioxythiophene) (PEDT), the hole-transporting polymer when used is poly(4,4'-biphenylene-diyl-N'N'-diphenyldiamino-1,4-phenylene) described in U.S. Pat. No. 5,728,801, hereinafter abbreviated as "P3DA", and the electron-transporting layer when used is the aluminum complex of 8-hydroxyquinoline hereinafter abbreviated as "Alq". Films of PEDT are formed by spin coating from aqueous solutions of the polymer obtained from Bayer Corporation. Films of P3DA are formed by spin coating from chlorobenzene solutions. Alq films are formed by thermal evaporation in high vacuum. Multi-layer devices are fabricated by laying, down the layers sequentially starting from the layer next to the ITO. After all the layers have been deposited, the appropriate metallic cathodes are then deposited on top of the organic film by thermal evaporation. Magnesium alloys in this instance are alloys of magnesium containing at least 85 percent of magnesium. The active polymer is deposited by spin-coating from organic solution (toluene).

| Electroluminescent Devices: | | | | | |
|---|---|---|---|---|---|
| Device No. | Hole Injection | Hole Transport | Polymer | Electron Transport | Cathode |
| D1 | — | — | 64 | — | Mg alloy |
| D2 | — | — | 64 | Alq | " |
| D3 | — | P3DA | 64 | — | " |
| D4 | — | P3DA | 64 | Alq | " |
| D5 | PEDT | PVK | 64 | — | Al |
| D6 | — | PVK | 64 | — | Al[1] |
| D7 | PEDT | — | 64 | — | Al[1] |

[1] A thin layer of calcium or barium (ca. 5 nm) is present between the electron transport layer and the cathode;
PVK = polyvinylcarbazol

The invention claimed is:
1. A polymer comprising a repeating unit of the formula

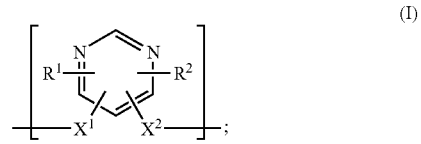

wherein
R[1] is $C_{6-24}$ aryl or $C_{2-20}$ heteroaryl each of which optionally can be substituted, and R[2] is H,
X[1] and X[2] are independently of each other a divalent linking group which co-polymer also comprises a co-monomer T which is selected from the group consisting of

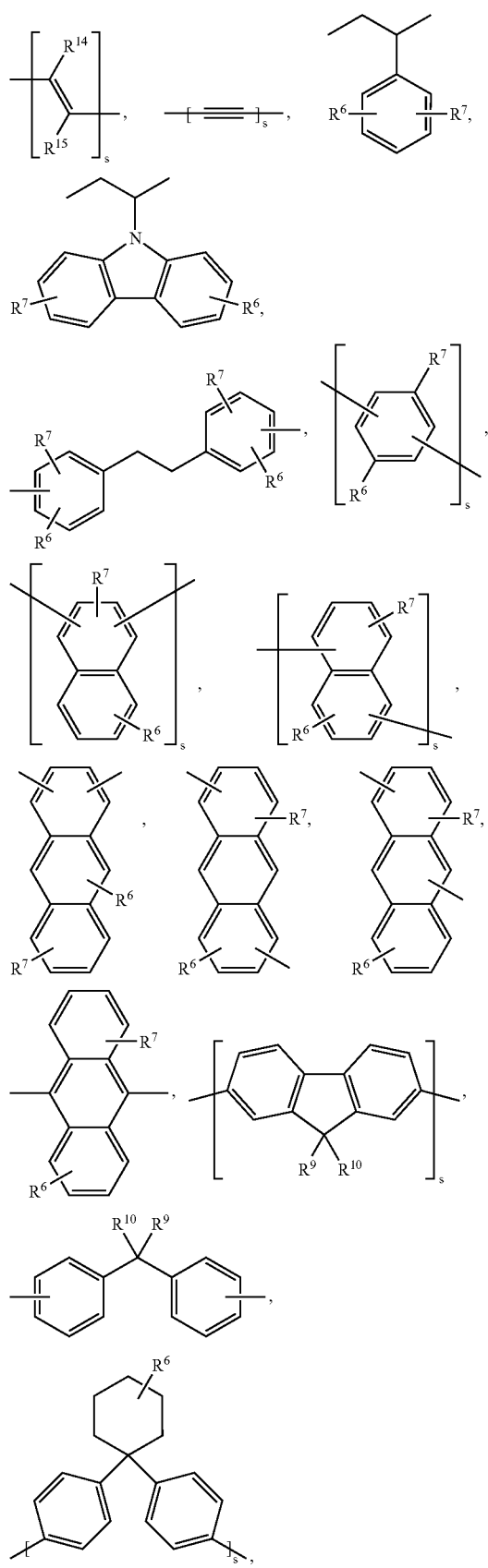

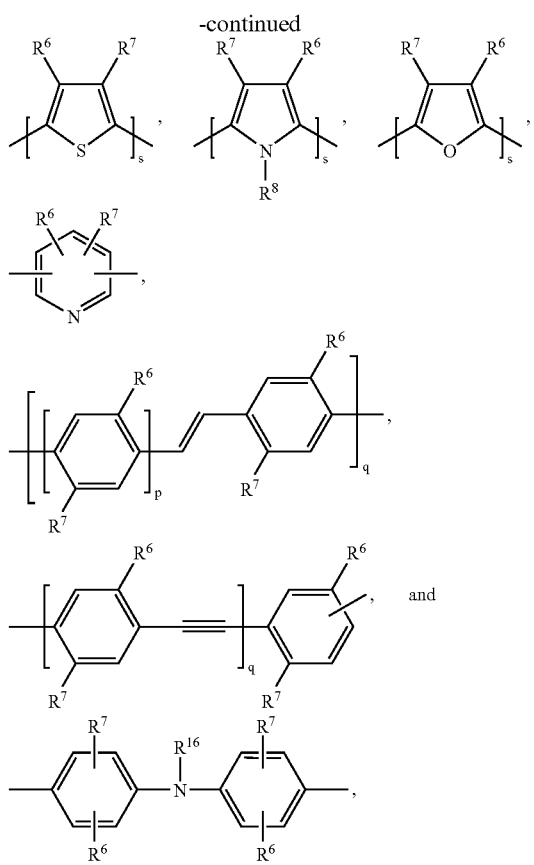

-continued wherein
R[16] is H, $C_6$-$C_{18}$aryl, $C_6$-$C_{18}$aryl which is substituted by $C_1$-$C_{18}$alkyl, $C_1$-$C_{18}$alkyl, $C_7$-$C_{25}$aralkyl, or $C_1$-$C_{18}$alkyl which is interrupted by —O—, p is an integer from 1 to 10, q is an integer from 1 to 10, s is an integer from 1 to 10, R[6] and R[7] are independently of each other H, $C_1$-$C_{18}$alkyl, $C_1$-$C_{18}$alkyl which is substituted by E and/or interrupted by D, $C_5$-$C_{12}$cycloalkyl, $C_5$-$C_{12}$cycloalkyl, which is substituted by E, $C_6$-$C_{24}$aryl, $C_6$-$C_{24}$aryl which is substituted by E, $C_2$-$C_{20}$heteroaryl, $C_2$-$C_{20}$heteroaryl which is substituted by E, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or —CO—R[28], R[8] is $C_1$-$C_{18}$alkyl, $C_1$-$C_{18}$alkyl which is substituted by E and/or interrupted by D, $C_6$-$C_{24}$ aryl, or $C_7$-$C_{25}$aralkyl, R[9] and R[10] are independently of each other $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{20}$heteroaryl, $C_2$-$C_{20}$heteroaryl which is substituted by E, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, or $C_7$-$C_{25}$aralkyl, or R[9] and R[10] form a five- or six-membered ring, which may optionally be substituted by R[6], R[14'] and R[15'] are independently of each other H, $C_1$-$C_{18}$alkyl, $C_1$-$C_{18}$alkyl which is substituted by E and/or interrupted by D, $C_6$-$C_{24}$aryl, $C_6$-$C_{24}$aryl which is substituted by E, $C_2$-$C_{20}$heteroaryl, or $C_2$-$C_{20}$heteroaryl which is substituted by E, D is —CO—, —COO—, —S—, —SO—, —SO$_2$—, —O—, —NR$^{25}$—, —SiR$^{30}$R$^{31}$—, —POR$^{32}$—, —CR$^{23}$=CR$^{24}$—, or —C≡C—, and E is —OR$^{29}$, —SR$^{29}$, —NR$^{25}$R$^{26}$, —COR$^{28}$, —COOR$^{27}$, —CONR$^{25}$R$^{26}$, —CN, —OCOOR$^{27}$, or halogen, wherein R$^{23}$, R$^{24}$, R$^{25}$ and R$^{26}$ are independently of each other H, C$_6$-C$_{18}$aryl, C$_6$-C$_{18}$aryl which is substituted by C$_1$-C$_{18}$alkyl, C$_1$-C$_{18}$alkoxy, C$_1$-C$_{18}$alkyl, or C$_1$-C$_{18}$alkyl which is interrupted by —O—, or R$^{25}$ and R$^{26}$ together form a five or six membered ring, R$^{27}$ and R$^{28}$ are independently of each other H, C$_6$-C$_{18}$aryl, C$_6$-C$_{18}$aryl which is substituted by C$_1$-C$_{18}$alkyl, or C$_1$-C$_{18}$alkoxy, C$_1$-C$_{18}$alkyl, or C$_1$-C$_{18}$alkyl which is interrupted by —O—, R$^{29}$ is H, C$_6$-C$_{18}$aryl, C$_6$-C$_{18}$aryl, which is substituted by C$_1$-C$_{18}$alkyl, C$_1$-C$_{18}$alkoxy, C$_1$-C$_{18}$alkyl, or C$_1$-C$_{18}$alkyl which is interrupted by —O—, R$^{30}$ and R$^{31}$ are independently of each other C$_1$-C$_{18}$alkyl, C$_6$-C$_{18}$aryl, or C$_6$-C$_{18}$aryl, which is substituted by C$_1$-C$_{18}$alkyl, and R$^{32}$ is C$_1$-C$_{18}$alkyl, C$_6$-C$_{18}$aryl, or C$_6$-C$_{18}$aryl, which is substituted by C$_1$-C$_{18}$alkyl, or R$^9$ and R$^{10}$ together form a group of formula =CR$^{100}$R$^{101}$, wherein R$^{100}$ and R$^{101}$ are independently of each other H, C$_1$-C$_{18}$alkyl, C$_1$-C$_{18}$alkyl which is substituted by E and/or interrupted by D, C$_6$-C$_{24}$aryl, C$_6$-C$_{24}$aryl which is substituted by E, or C$_2$-C$_{20}$heteroaryl, or C$_2$-C$_{20}$heteroaryl which is substituted by E, and R$^{14}$ and R$^{15}$ are independently of each other H, C$_1$-C$_{18}$alkyl, C$_1$-C$_{18}$alkyl which is substituted by E and/or interrupted by D, C$_6$-C$_{24}$aryl, C$_6$-C$_{24}$aryl which is substituted by E, or C$_2$-C$_{20}$heteroaryl, C$_2$-C$_{20}$heteroaryl which is substituted by E.

2. A polymer according to claim 1, comprising a co-monomer T which is selected from the group consisting of

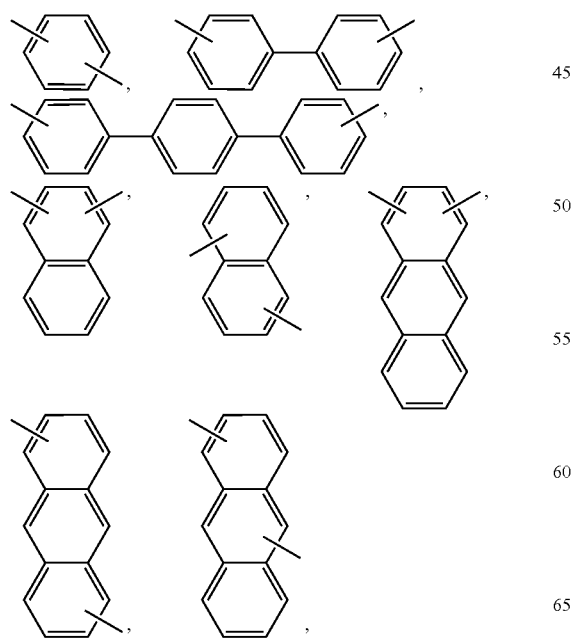

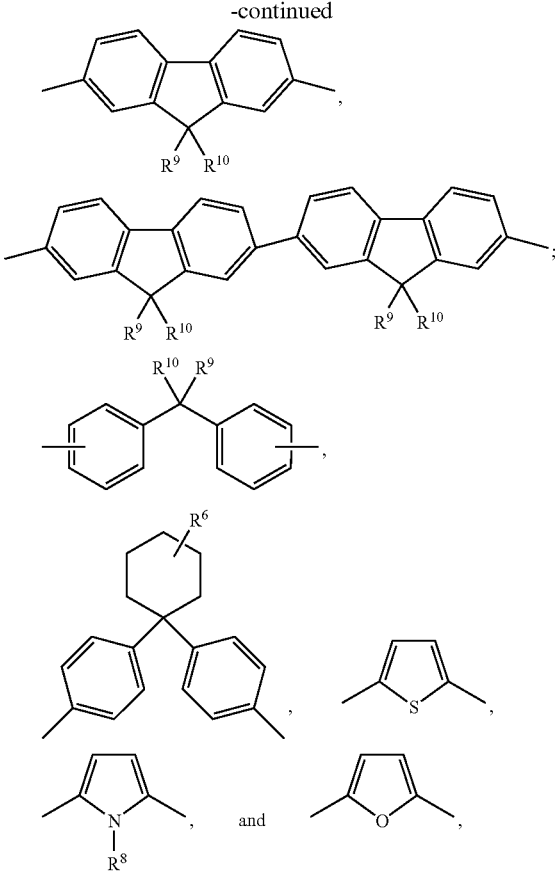

wherein R$^8$ is C$_1$-C$_{18}$alkyl,

R$^9$, and R$^{10}$ are independently of each other C$_1$-C$_{18}$alkyl, which can be interrupted by one or two oxygen atoms, or R$^9$ and R$^{10}$ form a five or six membered carbocyclic ring, which optionally can be substituted by C$_1$-C$_8$alkyl.

3. A polymer according to claim 1, comprising a repeating unit of formula

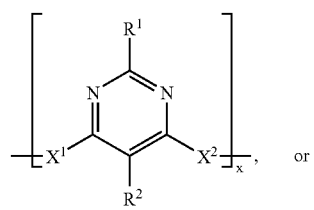
(Ia)

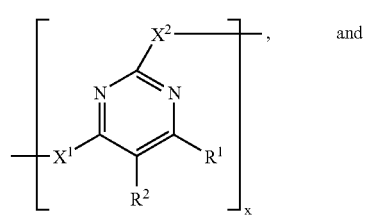
(Ib)

a co-monomer

wherein
x is in the range of 0.4 to 0.6, and y is in the range of 0.6 to 0.4, wherein the sum of x and y is 1,
$R^1$ is a group of formula

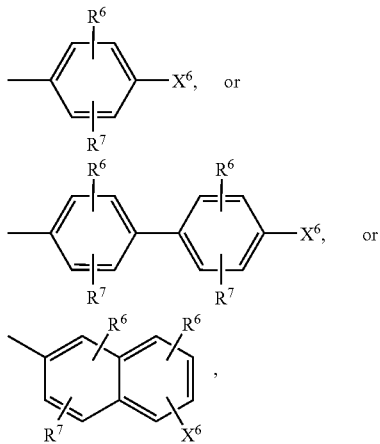

wherein
$X^6$ is H, $C_1$-$C_{18}$alkyl, cyclohexyl, or $C_1$-$C_{18}$alkoxy,
$R^2$ is H, $X^1$ and $X^2$ are independently of each other a group of formula

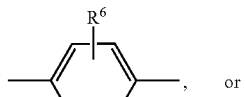, or

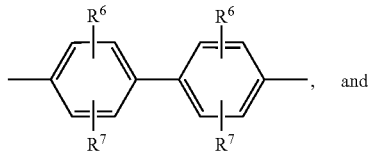, and

T is a group of formula

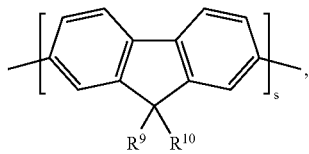, wherein s is one or two, and $R^9$ and $R^{10}$ are independently of each other $C_1$-$C_{18}$alkyl, which can be interrupted by one or two oxygen atoms, and
$R^6$ and $R^7$ are independently of each other H, $C_1$-$C_{12}$alkyl, $C_5$-$C_{12}$cycloalkyl, $C_6$-$C_{24}$aryl, which can be substituted by —O—$C_1$-$C_{12}$alkyl, or $C_1$-$C_{18}$alkoxy.

* * * * *

UNITED STATES PATENT AND TRADEMARK OFFICE
CERTIFICATE OF CORRECTION

PATENT NO. : 7,649,077 B2
APPLICATION NO. : 10/531779
DATED : January 19, 2010
INVENTOR(S) : Craig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1102 days.

Signed and Sealed this

Twenty-third Day of November, 2010

David J. Kappos
*Director of the United States Patent and Trademark Office*